United States Patent
Chuang et al.

(10) Patent No.: US 12,426,260 B2
(45) Date of Patent: Sep. 23, 2025

(54) MEMORY DEVICE WITH ONE-TIME PROGRAMMABLE MEMORY UNIT AND METHOD FOR FABRICATING THE SAME

(71) Applicant: TAIWAN SEMICONDUCTOR MANUFACTURING COMPANY, LTD., Hsinchu (TW)

(72) Inventors: Harry-Hak-Lay Chuang, Hsinchu County (TW); Wen-Chun You, Yilan County (TW); Hung-Cho Wang, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 1060 days.

(21) Appl. No.: 17/461,340

(22) Filed: Aug. 30, 2021

(65) Prior Publication Data

US 2023/0061882 A1    Mar. 2, 2023

(51) Int. Cl.
*H10B 20/25*     (2023.01)
*H10N 50/01*     (2023.01)
*H10N 50/80*     (2023.01)

(52) U.S. Cl.
CPC ............. *H10B 20/25* (2023.02); *H10N 50/01* (2023.02); *H10N 50/80* (2023.02)

(58) Field of Classification Search
CPC ......... H10B 20/20; H10N 50/80; H10N 50/01
USPC ....................................................... 257/379
See application file for complete search history.

(56) References Cited

U.S. PATENT DOCUMENTS

| | | | |
|---|---|---|---|
| 10,331,999 B2* | 6/2019 | Torng | G06N 3/063 |
| 10,861,524 B1* | 12/2020 | Roy | G11C 11/1693 |
| 11,049,539 B1* | 6/2021 | Sanjeevarao | G11C 11/1655 |
| 11,688,481 B2* | 6/2023 | Yuh | G11C 17/18 365/96 |
| 12,080,378 B2* | 9/2024 | García Redondo | G11C 7/16 |
| 2006/0250867 A1* | 11/2006 | Yang | G11C 11/1675 365/201 |
| 2018/0082732 A1* | 3/2018 | Luo | G11C 8/10 |
| 2021/0201998 A1* | 7/2021 | Yuh | G11C 14/0081 |
| 2022/0028928 A1* | 1/2022 | Seo | H10N 50/85 |
| 2023/0147686 A1* | 5/2023 | Yuh | G11C 11/418 365/154 |

* cited by examiner

*Primary Examiner* — Jami Valentine Miller
(74) *Attorney, Agent, or Firm* — Maschoff Brennan

(57) ABSTRACT

A memory device includes an one-time-programmable (OTP) memory unit. The OTP memory unit includes a first gate, a first conductive segment and a second conductive segment of a first structure, and a first magnetic tunnel junction (MTJ) component. The first gate is formed across an active region, and corresponds to gate terminals of a first transistor and a second transistor. The first conductive segment and the second conductive segment of the first structure are formed above the active region, and correspond to a first source/drain terminal of the first transistor and a first source/drain terminal of the second transistor, respectively. The first MTJ component is formed in a first conductive layer above the active region, and is coupled to the first conductive segment and the second conductive segment for receiving a programming signal from a data line. A method for fabricating a memory device is also disclosed herein.

20 Claims, 8 Drawing Sheets

MEMORY DEVICE WITH ONE-TIME PROGRAMMABLE MEMORY UNIT AND METHOD FOR FABRICATING THE SAME

BACKGROUND

Memory devices have been used in various applications. Generally, the memory devices include, for example, volatile memory device and non-volatile memory device. Data stored in the non-volatile memory device are retained in the absence of power. The non-volatile memory device includes, for example, magnetoresistive random-access memory (MRAM) cell. The MRAM cell stores data using a magnetic junction that is disposed between two ferromagnetic elements.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
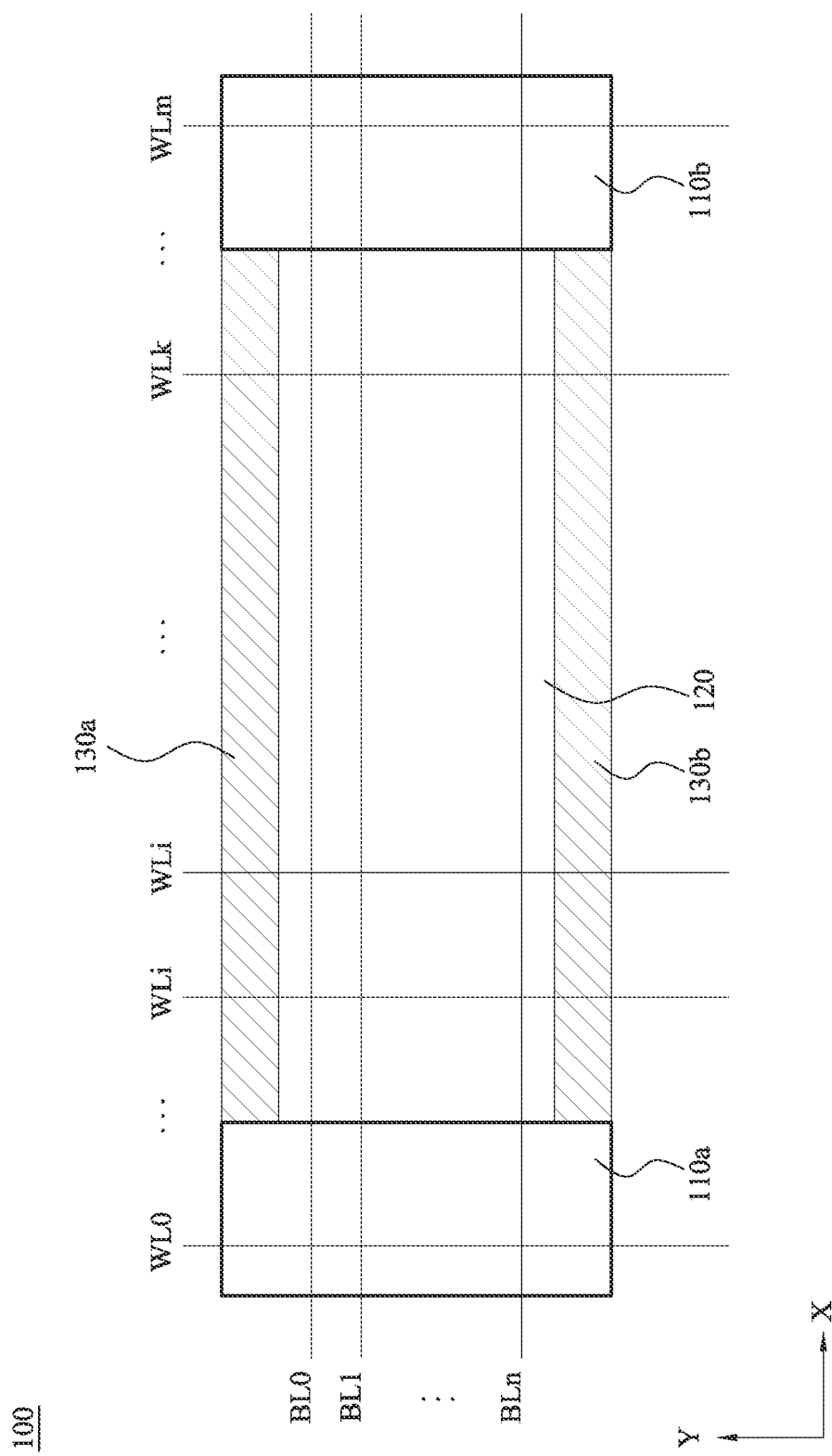
FIG. 1 is a schematic diagram of a memory device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

In this document, the term "coupled" may also be termed as "electrically coupled", and the term "connected" may be termed as "electrically connected". "Coupled" and "connected" may also be used to indicate that two or more elements cooperate or interact with each other.

Furthermore, spatially relative terms, such as "underlying," "below," "lower," "overlying," "upper" and the like, may be used throughout the description for ease of understanding to describe one element or feature's relationship to another element(s) or feature(s) as illustrated in the figures. The spatially relative terms are intended to encompass different orientations of the device in use or operation in addition to the orientation depicted in the figures. The structure may be otherwise oriented (e.g., rotated 90 degrees or at other orientations) and the spatially relative descriptors used herein may likewise be interpreted accordingly.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

FIG. 1 is a schematic diagram of a memory device 100, in accordance with some embodiments of the present disclosure. In some embodiments, the memory device 100 is a memory including at least one of a non-volatile memory (NVM) cell or a volatile memory (VM) cell.

For illustration of FIG. 1, the memory device 100 includes one-time-programmable (OTP) memory arrays 110a and 110b, a memory array 120 and strap arrays 130a and 130b. With respect to an X-direction, the memory array 120 is disposed between the OTP memory arrays 110a and 110b. With respect to a Y-direction, the memory array 120 is disposed between the strap arrays 130a and 130b. Alternatively stated, the memory array 120 is surrounded by the OTP memory arrays 110a and 110b and the strap arrays 130a and 130b. In some embodiments, the OTP memory array 110a is disposed between a first logic circuit (not shown) and the memory array 120, and the OTP memory array 110b is disposed between a second logic circuit (not shown) and the memory array 120.

The memory device 100 further includes word lines WL0, . . . , WLi, WLj, . . . , WLk, . . . , and WLm, and bit lines BL0, BL1, . . . , and BLn. The word lines WL0, . . . , WLi, WLj, . . . , WLk, . . . , and WLm, and bit lines BL0, BL1, . . . , and BLn are coupled to units (not shown in FIG. 1) of the arrays 110a-110b, 120, and 130a-130b. For simplicity, each of the word lines WL0, . . . , WLi, WLj, . . . , WLk, . . . , and WLm is referenced as WL hereinafter for illustration, because the word lines WL0, . . . , WLi, WLj, . . . , WLk, . . . , and WLm operate in a similar way in some embodiments. Based on the similar reasons, each of the bit lines BL0, BL1, . . . , and BLn is referenced as BL hereinafter.

As illustrated in FIG. 1, the word lines WL extend along the Y-direction, and are separated from each other along the X-direction. In some embodiments, some of the word lines WL are disposed across and are coupled to the OTP memory array 110a or 110b. Some other word lines WL are disposed across and are coupled to the memory array 120 and the strap arrays 130a and 130b. For example, with reference to FIG. 1, the word line WL0 and some word lines (not shown) are arranged across the OTP memory array 110a. The word line WLm and some word lines (not shown) are arranged across the OTP memory array 110b. The word lines WLi, WLj, . . . , WLk and some other word lines (not shown) are arranged across each of the memory array 120 and the strap arrays 130a and 130b.

In some embodiments, the word lines WL are further coupled to a first control circuit (not shown). The first control circuit is configured to select at least one of the word lines WL by selectively charging such word line WL, for activating the units of the corresponding arrays 110a-110b, 120, or 130a-130b that are coupled to such word line WL.

As illustrated in FIG. 1, the bit lines BL extend along the X-direction, and are separated from each other along the Y-direction. In some embodiments, the bit lines BL are disposed across and are coupled to each of the OTP memory arrays 110a-110b and the memory array 120. Alternatively stated, the OTP memory arrays 110a-110b and the memory array 120 share the bit lines BL.

In some embodiments, the bit lines BL are further coupled to a second control circuit (not shown). The second control circuit is configured to select at least one of the bit lines BL by selectively charging such bit line BL, for writing bit data into or reading bit data from the units of the corresponding arrays 110a-110b, 120, or 130a-130b that are coupled to such bit line BL.

Figure 2:
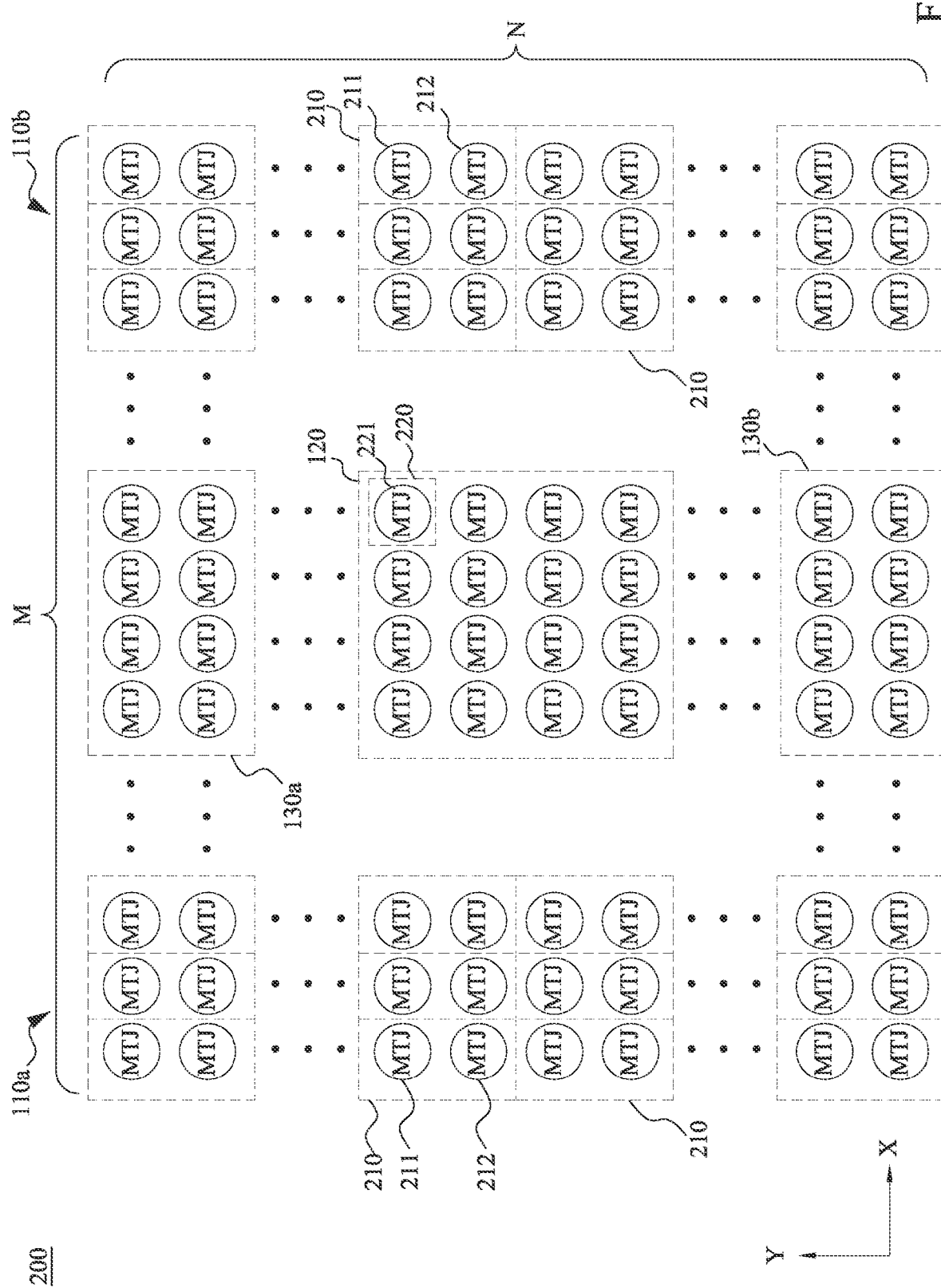
FIG. 2 is a schematic layout diagram of a memory device corresponding to the memory device shown in FIG. 1, in accordance with some embodiments of the present disclosure.

Each of the OTP memory arrays 110a and 110b includes OTP memory units (for example, OTP units 210 as shown in FIG. 2), in some embodiments. Each of the OTP memory units is configured to store a bit data, and is discussed in detailed below with reference to FIGS. 2-6B. In some embodiments, each of the OTP memory units is coupled to one of the word lines WL and one of the bit lines BL, for accessing the corresponding bit data. In some other embodiments, each of the OTP memory units is write-locked, and is implemented by fuses, anti-fuses or combination thereof, with magnetic junction. In various embodiments, the operation of accessing the bit data includes the operations of writing (programming) the bit data into and reading the bit data from the corresponding units.

The memory array 120 includes memory units (for example, memory units 220 as shown in FIG. 2), in some embodiments. Each of the memory units is configured to store a bit data. In some embodiments, each of the memory units is coupled to one of the word lines WL and one of the bit lines BL, for accessing the corresponding bit data. In some other embodiments, each of the memory units is implemented by a magnetoresistive random-access memory (MRAM) cell. Each of the memory units can be formed by other equivalent MRAM cells, and various configurations of the memory units are within the contemplated scope of the present disclosure.

Each of the strap arrays 130a and 130b includes strap units (not shown), in some embodiments. Each of the strap units is configured as dummy units, for isolating the memory array 120 from other adjacent circuits. In some embodiments, each of the strap units has the same configurations that the OTP memory units of the OTP memory arrays 110a and 110b have, and is electrically floating.

The configurations of the memory device 100 as illustrated above are given for illustrative purposes. Various configurations of the memory device 100 are within the contemplated scope of the present disclosure. For example, in various embodiments, the displacements of the OTP memory arrays 110a-110b and the strap arrays 130a-130b are exchanged. In some other embodiments, the word lines WL extend along the X-direction and are arranged along the Y-direction. The bit lines extend along the Y-direction and are arranged along the X-direction. In another example, in alternative embodiments, at least one of the strap array 130a or 130b is substituted by the OTP memory array 110a or 110b.

Reference is now made to FIG. 2. FIG. 2 is a schematic layout diagram of a memory device 200, in accordance with some embodiments of the present disclosure. In some embodiments, the memory device 200 illustrated in FIG. 2 corresponds to the memory device 100 illustrated in FIG. 1. As such, similar configurations are not further detailed herein, and like elements in FIG. 2 are designated with the same reference numbers with respect to the embodiments of FIG. 1, for ease of understanding. For simplicity of illustration, only a part of the memory device 200, which includes some units arranged in M columns and N rows, is illustrated in FIG. 2.

With reference to FIGS. 1-2, the OTP memory array 110a and 110b include OTP memory units 210. The OTP memory units 210 are disposed in columns and rows. Each one of the OTP memory units 210 includes at least two adjacent cells.

For example, as illustrated in FIG. 2, one of the OTP memory units 210 includes a first cell 211 and a second cell 212. The first cell 211 and the second cell 212 are disposed next to each other, with respect to the Y-direction. For simplicity of illustration in FIG. 2, only a few OTP memory units 210 and a few first cells 211 and second cells 212 are labeled.

Furthermore, with reference to FIGS. 1-2, the memory array 120 includes memory units 220. The memory units 220 are disposed in columns and rows, and some of the memory units 220 are disposed next to the OTP memory units 210. Each one of the memory units 220 includes at least one cell. For example, as illustrated in FIG. 2, one of the memory units 220 includes a memory cell 221. For simplicity of illustration in FIG. 2, only one memory unit 220 and one memory cell 221 are labeled.

Figure 4:
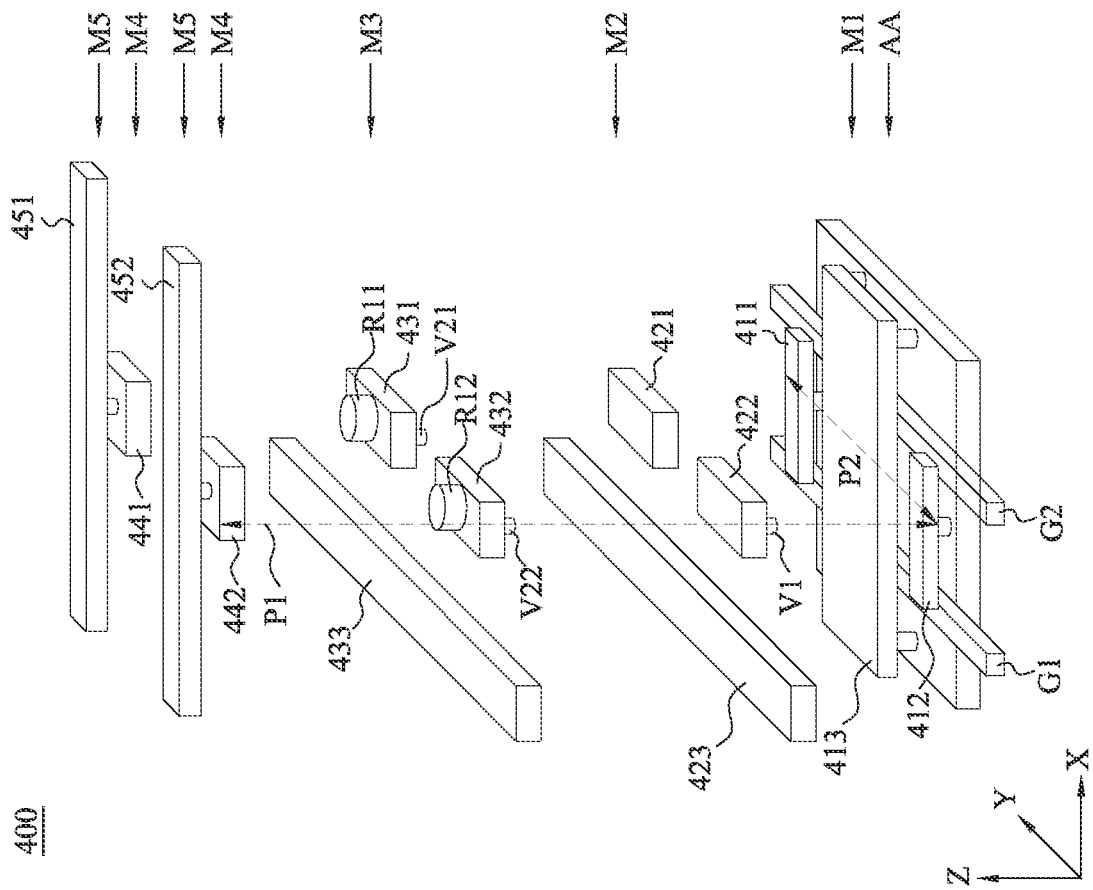
FIG. 4 is a layout diagram of an OTP memory unit corresponding to the OTP memory unit shown in FIG. 3, in accordance with some embodiments of the present disclosure.
Figure 3:
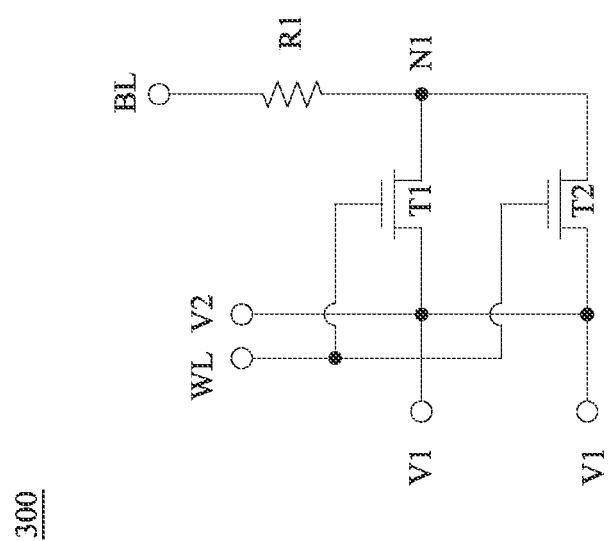
FIG. 3 is a circuit diagram of an one-time-programmable (OTP) memory unit corresponding to an OTP memory unit of the memory device shown in FIG. 2, in accordance with some embodiments of the present disclosure.

Each one of the OTP memory units 210 is configured to store one bit data, in some embodiments. Specifically, in each one of the OTP memory units 210, the first cell 211 is configured to be electrically floating, as a dummy MRAM cell. The second cell 212 is configured to store the bit data, as a MRAM cell. In some embodiments, each of the first cell 211 and the second cell 212 includes at least one transistor (which is shown in FIG. 3) and one magnetic tunnel junction (MTJ) component (which is shown in FIG. 4). In various embodiments, the MTJ components included in the OTP memory unit 210 are configured to be programmed once. Alternatively stated, the OTP memory unit 210 is referred to as a non-volatile memory (NVM) cell, and is implemented by at least two MRAM cells.

The MTJ component includes a reference element, a barrier element and a free element, in some embodiments. The barrier element is sandwiched between the reference element and the free element, to separate them from each other. In various embodiments, the MTJ component is implemented by spin valves or some other suitable magnetic junctions.

In some embodiments, a data state of the MTJ component depends on whether the barrier element is breakdown. For example, in some embodiments, when the barrier element is breakdown, leakage current flows between the reference element and the free element. As such, the MTJ component has a low resistance, which corresponds to a first data state. On the other hand, when the barrier element is not breakdown, the MTJ component has a high resistance, which corresponds to a second data state.

In addition, the MTJ component is configured to be programmed once by breaking down the barrier element, in some embodiments. As such, the data state, corresponding to the bit data "0" or "1", stored in the MTJ component is unchangeable and irreversible accordingly. In various embodiments, such MTJ component is utilized in the OTP memory cell including, for example, the first cell 211 and the second cell 212 of the OTP memory unit 210.

Each one of the memory units 220 is configured to store one bit data, in some embodiments. Specifically, in each one of the memory units 220, the memory cell 221 includes one MTJ component (not shown). In various embodiments, the MTJ component included in the memory unit 220 is configured to be accessed at least one time. Alternatively stated, the memory unit 220 is referred to as a volatile memory (VM) cell, and is implemented by one MRAM cell. In various embodiments, the MTJ component of the memory unit 220 and the MTJ component of the OTP memory unit 210 are formed in the same metal layer of the memory device 200.

In some embodiments, a data state of the MTJ component depends on magnetizations of the reference element and the free element. For example, in some embodiments, when the reference element and the free element are magnetic parallel, the MTJ component has a low resistance, which corresponds to a first data state. On the other hand, when the reference element and the free element are magnetic anti-parallel, the MTJ component has a high resistance, which corresponds to a second data state.

In addition, the MTJ component is configured to be programmed and/or erased multiple times by changing the magnetizations of the reference element and the free element, in some embodiments. Therefore, the data state, corresponding to the bit data "0" or "1", stored in the MTJ component is changed accordingly. In various embodiments, such MTJ component is utilized in the memory cell including, for example, the memory cell 221 of the memory unit 220.

The number and arrangement of the OTP memory units 210 and the memory units 220 shown in FIG. 2 are given for illustrative purposes. Various numbers and arrangements of the OTP memory units 210 and the memory units 220 to implement the memory device 200 illustrated in FIG. 2 are within the contemplated scope of the present disclosure. For example, in some embodiments, in addition to the first and the second cells 211 and 212, each one of the OTP memory units 210 includes more than two cells. Such additional cell(s) has/have the same configurations of the first cell 211 or the second cell 212.

Reference is now made to FIG. 3. FIG. 3 is a circuit diagram of an OTP memory unit 300, in accordance with some embodiments of the present disclosure. In some embodiments, the OTP memory unit 300 corresponds to one of the OTP memory units 210 shown in FIG. 2. In some other embodiments, the circuit illustrated in FIG. 3 is an equivalent circuit of one of the OTP memory units 210 shown in FIG. 2. For ease of understanding, the embodiments with respect to FIG. 3 are discussed with reference to FIG. 2. With respect to the embodiments of FIG. 2, like elements in FIG. 3 are designated with the same reference numbers for ease of understanding.

As illustrated in FIG. 3, the OTP memory unit 300 includes a transistor T1, a transistor T2 and a MTJ component R1. The transistor T1 and the transistor T2 which, in some embodiments, are n-type metal oxide semiconductor transistors (NMOS transistors), are coupled in parallel. Specifically, gate terminals of the transistors T1 and T2 are coupled together, and are further coupled to a word line WL. A drain terminal of the transistor T1 is coupled to a drain terminal of the transistor T2 at a node N1, which is further coupled to a first terminal of the MTJ component R1. A source terminal of the transistor T1 and a source terminal of the transistor T2 are coupled to respective nodes (not labeled) which are coupled to the same reference voltage V1. In addition, the source terminals of the transistors T1 and T2 are coupled together, and are further coupled to a node (not labeled) which is coupled to a reference voltage V2. In some embodiments, in operations, the source terminals of the transistors T1 and T2 are together coupled to the reference voltage V1 or the reference voltage V2, depending on the expected data state of the MTJ component R1.

The MTJ component R1 is coupled between the node N1 and another node (not labeled) that is further coupled to a bit line BL. Specifically, a first terminal of the MTJ component R1 is coupled to the node N1, and a second terminal of the MTJ component R1 is coupled to the bit line BL.

In some embodiments, at least one of the transistor T1 or T2 is implemented by at least one transistor. For example, the transistor T1 is implemented by two PMOS transistors that are coupled in parallel, and the transistor T2 is implemented by another two PMOS transistors that are coupled in parallel, which is discussed in detailed with reference to FIGS. 5A-6B. Alternatively stated, the transistors T1 and T2 shown in FIG. 3 are equivalent transistors in one of the OTP memory units 210 shown in FIG. 2. In various embodiments, the transistor T1 corresponds to at least one transistor that is included in the first cell 211 illustrated in FIG. 2. The transistor T2 corresponds to at least one transistor that is included in the second cell 212 illustrated in FIG. 2.

In some embodiments, the MTJ component R1 is implemented by at least one MTJ components. For example, the MTJ component R1 is implemented by two independent MTJ components, which is discussed in detailed with reference to FIG. 4. Alternatively stated, the MTJ component R1 shown in FIG. 3 is an equivalent MTJ component in one of the OTP memory unit 210 shown in FIG. 2. In various embodiments, the MTJ component R1 corresponds to a MTJ component that is included in the second cell 212, since a MTJ component included in the first cell 211 is as a dummy component, as discussed above with reference to FIG. 2.

In a programming operation, in some embodiments, to write a bit data "0" into the MTJ component R1, the barrier element of the MTJ component R1 is configured to be breakdown. Specifically, the word line WL is charged, and a selecting voltage/signal is providing through the word line WL to the gate terminals of the transistors T1-T2. The transistors T1-T2 are activated, in response to the selecting signal. In addition, the reference voltage V2 is provided to the source terminals of the transistors T1-T2, and a programming voltage/signal is providing through the bit line BL to the node N1, which is also referred to as the drain terminals of the transistors T1-T2. In some embodiments, the programming voltage from the bit line BL is substantially equal to the reference voltage V2, and a difference therebetween is large enough to break down the barrier element of the MTJ component R1. With such configurations, the magnetization of the MTJ component R1 is magnetic parallel, and the MTJ component R1 has a low resistance. Accordingly, the bit data "0", corresponding to the first data state, is written into the MTJ component R1.

In a programming operation, in some embodiments, to write a bit data "1" into the MTJ component R1, the barrier element of the MTJ component R1 is configured to be unbroken-down. Similar to the programming operation of writing the bit data "0", a selecting voltage/signal is providing through the word line WL to the gate terminals of the transistors T1-T2, for activating the transistors T1-T2. In addition, the reference voltage V1 is provided to the source terminals of the transistors T1-T2, and a programming voltage/signal is providing through the bit line BL to the node N1. In some embodiments, the programming voltage from the bit line BL is different from the reference voltage V1, and a difference therebetween is unable to break down the barrier element of the MTJ component R1. With such configurations, the magnetization of the MTJ component R1 is magnetic anti-parallel, and the MTJ component R1 has a high resistance. Accordingly, the bit data "1", corresponding to the second data state, is written into the MTJ component R1.

The configurations of the circuit shown in FIG. 3 are given for illustrative purposes. Various configurations of the circuit to implement the OTP memory unit 300 illustrated in FIG. 3 are within the contemplated scope of the present disclosure. For example, in some embodiments, the transistors T1 and T2 are implemented by p-type metal oxide semiconductor transistors (PMOS transistors).

Reference is now made to FIG. 4. FIG. 4 is a layout diagram of an OTP memory unit 400, in accordance with some embodiments of the present disclosure. In some embodiments, the OTP memory unit 400 corresponds to one of the OTP memory units 210 illustrated in FIG. 2. In various embodiments, an equivalent circuit of the OTP memory unit 400 is the circuit illustrated in in FIG. 3. As such, similar configurations are not further detailed herein. For ease of understanding, the embodiments with respect to FIG. 4 are discussed with reference to FIGS. 2-3. For simplicity of illustration, only a few metal layers M1-M5 and some elements that are associated with the OTP memory unit 400 are illustrated in FIG. 4.

As illustrated in FIG. 4, the OTP memory unit 400 includes semiconductor structures (not shown) formed in an active region AA, and some metal structures 411-451 and magnetic structures R11-R12 formed in continuous metal layers M1, M2, M3, M4 and M5. The metal layers M1-M5 are disposed above the active region AA. The metal structures 411-451 and magnetic structures R11-R12 are discussed in detailed below with reference to FIG. 4.

The semiconductor structures include gates G1 and G2 and other structures SD1, SD2 and SD3 (at least shown in FIGS. 5A-6B) are disposed within the active region AA, which is discussed in detailed below with reference to FIGS. 5A-6B. With reference to FIG. 4, the gates G1-G2 extend along the Y-direction, and are separated from each other with respect to the X-direction.

In some embodiments, the semiconductor structures correspond to at least one transistor included in the first cell 211 and the second cell 212 illustrated in FIG. 2. In some other embodiments, the semiconductor structures correspond to the transistors T1 and T2 illustrated in FIG. 3.

Metal segments 411, 412 and 413 are formed in the metal layer M1 that is disposed above the active region AA. The metal segments 411-413 extend along the X-direction, and are separated from each other with respect to the Y-direction. The metal segment 413 is disposed across the gates G1-G2. In some embodiments, the metal segments 411 and 412 have the same size, and have identical structural configurations. In some other embodiments, the metal segment 413 has a size that is greater than a size of the metal segment 411 or 412.

In some embodiments, the metal segments 411 and 413 correspond to metal structures included in the first cell 211 in FIG. 2, and configured to as local interconnections of the OTP memory unit 400. In some other embodiments, the metal segments 412 and 413 correspond to the metal structures included in the second cell 212 in FIG. 2, and configured to as local interconnections of the OTP memory unit 400.

Furthermore, at least one gated metal segment (not shown) is further included in the OTP memory unit 400, and is formed in the metal layer M1, in some embodiments. Specifically, the gated metal segment, rather than the metal segments 411-413, is disposed across the gates G1 and G2, and is configured to couple to the gates G1 and G2 together, which corresponds to the gate terminals of the transistors T1 and T2 being coupled together illustrated in FIG. 3.

Metal segments 421 and 422, and a metal rail 423 are formed in the metal layer M2 that is disposed above the metal layer M1. The metal segments 421-422 and the metal rail 423 extend along the Y-direction, and are separated from each other. Specifically, the metal segments 421-422 are spaced apart from one another with respect to the Y-direction, and are disposed next to one side of the metal rail 423 with respect to the X-direction. The metal segment 421 is disposed above the metal segment 411, and the metal segment 422 is disposed above the metal segment 412. Alternatively stated, in a layout view, the metal segments 421 and 411 are partially overlapped, and the metal segments 422 and 412 are partially overlapped. In some embodiments, the metal segments 421 and 422 have the same size, and have identical structural configurations. In some other embodiments, the metal rail 423 has a size that is greater than a size of the metal segment 421 or 422.

A via V1 is further included in the OTP memory unit 400. The via V1 is formed between the metal layers M1 and M2. Specifically, the via V1 is formed between the metal segment 422 and the metal segment 412, for coupling the metal segments 422 and 412 together. It should be noted that, no via is formed between the metal segment 421 and the metal segment 411. With such configurations, the metal segment 411 is not coupled to the metal segment 421 or other metal segments formed in the metal layers M1-M5. As such, no signal is transmitted between the metal segment 411 and other metal segments including, for example, the metal segment 421, formed in other metal layers M2-M5.

In some embodiments, the metal segment 421 corresponds to a metal structure included in the first cell 211 in FIG. 2, and configured to as a local interconnection of the OTP memory unit 400, which is electrically floating. In some other embodiments, the metal segment 422 and the via V1 correspond to a metal structure included in the second cell 212 in FIG. 2, and configured to as a local interconnection of the OTP memory unit 400.

Furthermore, at least one via (not shown) is formed between the metal layers M1 and M2, in some embodiments. Specifically, such via is formed between the metal rail 423 and the gated metal segment that is formed in the M1 layer and is further coupled to the gates G1 and G2. The via is configured to couple the metal rail 423 and the gates G1 and G2 together.

In some embodiments, the metal rail 423 corresponds to a metal structure included in the first cell 211 and the second cell 212 in FIG. 2, and configured to as one part of the word line WL in FIG. 3.

Metal segments 431 and 432, a metal rail 433, and MTJ components R11 and R12 are formed in the metal layer M3 that is disposed above the metal layer M2. The metal segments 431-432 and the metal rail 433 extend along the Y-direction, and are separated from each other. The MTJ components R11 and R12 are separated from each other, with respect to the Y-direction. Specifically, the metal segments 431-432 are spaced apart from one another with respect to the Y-direction, and are disposed next to one side of the metal rail 433 with respect to the X-direction. The MTJ component R11 is formed above the metal segment 431, and is coupled to the metal segment 431. The MTJ component R12 is formed above the metal segment 432, and is coupled to the metal segment 432.

In addition, the MTJ component R11 and the metal segment 431 are disposed above the metal segment 421. The MTJ component R12 and the metal segment 432 are disposed above the metal segment 422. The metal rail 433 is disposed above the metal rail 423. Alternatively stated, in a layout view, the MTJ component R11 and the metal segment 431 are overlapped with the metal segment 421. In a layout view, the MTJ component R12 and the metal segment 432 are overlapped with the metal segment 422. In a layout view, the metal rail 433 is overlapped with the metal rail 423.

In some embodiments, the metal segments 431 and 432 have the same size, and have identical structural configurations. In some other embodiments, the metal segments 421-422 and 431-432 have the same size, and have identical structural configurations. In various embodiments, the metal rail 433 has a size that is greater than a size of the metal segment 431 or 432. In some embodiments, the metal rails 433 and 423 have the same size, and have identical structural configurations. In some other embodiments, the MTJ components R11 and R12 are two independent magnetic structures, and have identical structural configurations.

Vias V21 and V22 are further included in the OTP memory unit 400. The vias V21 and V22 are formed between the metal layers M2 and M3. Specifically, the via V21 is formed between the metal segment 431 and the metal segment 421, for coupling the metal segments 431 and 421 together. It should be noted that, since no via is formed between the metal segment 421 and the metal segment 411, the metal segment 431 and the MTJ component R11 are not coupled through the metal segment 421 to the metal segment 411. In addition, the via V22 is formed between the metal segment 432 and the metal segment 422, for coupling the metal segments 432 and 422 together. Since the metal segment 422 is further coupled to the metal segment 412, the MTJ component R12 coupled with the metal segment 432 is further coupled to the metal segment 412.

In some embodiments, the metal segment 431 and the via V21 correspond to a metal structure included in the first cell 211 in FIG. 2, and configured to as a local interconnection of the OTP memory unit 400, which is electrically floating. In some other embodiments, the MTJ component R11 correspond to a MTJ component included in the first cell 211 in FIG. 2, and configured to be electrically floating. In some embodiments, the metal segment 432 and the via V22 correspond to a metal structure included in the second cell 212 in FIG. 2, and configured to as a local interconnection of the OTP memory unit 400. In some other embodiments, the MTJ component R12 correspond to a MTJ component included in the second cell 212 in FIG. 2, and configured to store one bit data.

Furthermore, at least one via (not shown) is formed between the metal layers M2 and M3, in some embodiments. Specifically, such via is formed between the metal rail 433 and the metal rail 423. The via is configured to couple the metal rails 423 and 433 together.

In some embodiments, the metal rail 433 corresponds to a metal structure included in the first cell 211 and the second cell 212 in FIG. 2, and configured to as one part of the word line WL in FIG. 3. In various embodiments, the metal rails 423 and 433 together correspond to the word line WL in FIG. 3. Alternatively stated, a double word line WL, including the metal rails 423-433, is included in the OTP memory unit 400. The word line WL is configured to transmit a selecting voltage/signal to the gates G1-G2.

Metal segments 441 and 442 are formed in the metal layer M4 that is disposed above the metal layer M3. The metal segments 441-442 are separated from each other, with respect to the Y-direction. The metal segment 441 is disposed above the metal segment 431, and the metal segment 442 is disposed above the metal segment 432. Alternatively stated, in a layout view, the metal segment 441 is partially overlapped with the metal segment 431 and the MTJ component R11. In a layout view, the metal segment 442 is partially overlapped with the metal segment 432 and the MTJ component R12. In some embodiments, the metal segments 441 and 442 have the same size, and have identical structural configurations.

Furthermore, at least one via (not shown) is formed between the metal layers M3 and M4, in some embodiments. Specifically, such via is configured to couple the MTJ component R12 and the metal segment 442 together. For the via between the MTJ component R11 and the metal segment 441, since the metal segment 421 is electrically floating as discussed above, whether there is any via formed between the MTJ component R11 and the metal segment 441 does not change the floating state of the metal segment 421.

In some embodiments, the metal segment 441 corresponds to a metal structure included in the first cell 211 in FIG. 2, and configured to as a local interconnection of the OTP memory unit 400, which is electrically floating. In some other embodiments, the metal segment 442 corresponds to a metal structure included in the second cell 212 in FIG. 2, and configured to as a local interconnection of the OTP memory unit 400.

Metal rails 451 and 452 are formed in the metal layer M5 that is disposed above the metal layer M4. The metal rails 451-452 extend along the X-direction, and are separated from each other with respect to the Y-direction. The metal rail 451 is disposed above the metal segment 441, and the metal rail 452 is disposed above the metal segment 442. Alternatively stated, in a layout view, the metal rail 451 is partially overlapped with the metal segment 441. In a layout view, the metal rail 452 is partially overlapped with the metal segment 442. In some embodiments, the metal rails 451 and 452 have the same size, and have identical structural configurations.

Furthermore, vias (not labeled) are formed between the metal layers M4 and M5, in some embodiments. Specifically, one of the vias (not labeled) is formed between the metal rail 451 and the metal segment 441, for coupling the metal rail 451 and the metal segment 441 together. With such configurations, since the metal segment 421 is electrically floating as discussed above, no voltage/signal is transmitted therebetween the metal rail 451, the metal segment 441, the MTJ component R11, the via V21, and the metal segments 421 and 411.

In addition, another one of the vias (not labeled) is formed between the metal rail 452 and the metal segment 442, for coupling the metal rail 452 and the metal segment 442 together. As such, the metal rail 452 is coupled to the metal segment 442, the metal segment 442 is further coupled to the MTJ component R12 and the metal segment 432, the metal segment 432 is further coupled through the via V22 to the metal segment 422, and the metal segment 422 is further coupled through the via V1 to the metal segment 412, thereby, a current path P1 being formed therebetween.

In some embodiments, the metal rail 451 corresponds to a metal structure included in the first cell 211 in FIG. 2, and configured to be electrically floating. In some other embodiments, the metal rail 452 corresponds to the bit line BL in FIG. 3. The bit line BL is configured to transmit the programming voltage/signal at least along the path P1.

The current path P1 is coupled between the metal rail 452 and the metal segment 412, in some embodiments. Specifically, the current path P1 includes the metal rail 452, the metal segment 442, the MTJ component R12, the metal segment 432, the via V22, the metal segment 422, the via V1 and the metal segment 412. The current path P1 is further coupled to a current path P2. The current path P2 is coupled between the metal segment 411 and the metal segment 412, in some embodiments. Specifically, the current path P2 includes the metal segment 411, the structure SD2 (shown in FIGS. 5A-6B) in the active region AA, and the metal segment 412, which is discussed in detailed with reference to FIGS. 5A-6B.

In the programming operation, in some embodiments, with reference to FIGS. 3-4, a first programming voltage (not shown) is provided from the metal rail 452 to a top element of the MTJ component R12, which corresponding to one part of the current path P1. Meanwhile, the transistors T1 and T2 formed in the active region AA are activated in response to the word line WL, a second programming voltage (not shown) is provided from the transistors T1 and T2 to the metal segments 411 and 412, which corresponding to the current path P2. Specifically, the second programming voltage is provided at the drain terminals of the transistors T1 and T2, which is also referred to as the node N1.

Continued with reference to FIGS. 3-4, in the programming operation, since the transistors T1 and T2 are turned on, the second programming voltage at the node N1 depends on a reference voltage provided to the source terminals of the transistors T1 and T2. The reference voltage corresponds to the reference voltage V1 or V2 shown in FIG. 3. Thereby, the second programming voltage is provided from the transistors T1 and T2 in the active region AA to a bottom element of the MTJ component R12, which corresponding to the other part of the current path P1. The top and the bottom elements of the MTJ component R12 correspond to the free element and the reference element, in some embodiments. With such configuration, the barrier element of the MTJ component R12 is breakdown or unbroken, in response to the first and the second programming voltages. The MTJ component R12 stores a bit data accordingly.

A reading operation also involves the current paths P1 and P2, for reading the bit data from the MTJ component R12, in some embodiments. In various embodiments, the reading operation is similar to the programming operation, which is not discussed in detailed herein.

The configurations and arrangements of the layout diagram illustrated in FIG. 4 re given for illustrative purposes. Various configurations and arrangements of the layout diagram to implement the OTP memory unit 400 are within the contemplated scope of the present disclosure. For example, in some embodiments, in a layout view, at least one of the metal segments 411, 421, 431, 441 and the metal rail 451, the MTJ component R11 or the vias therebetween is removed from the OTP memory unit 400.

Figure 5B:
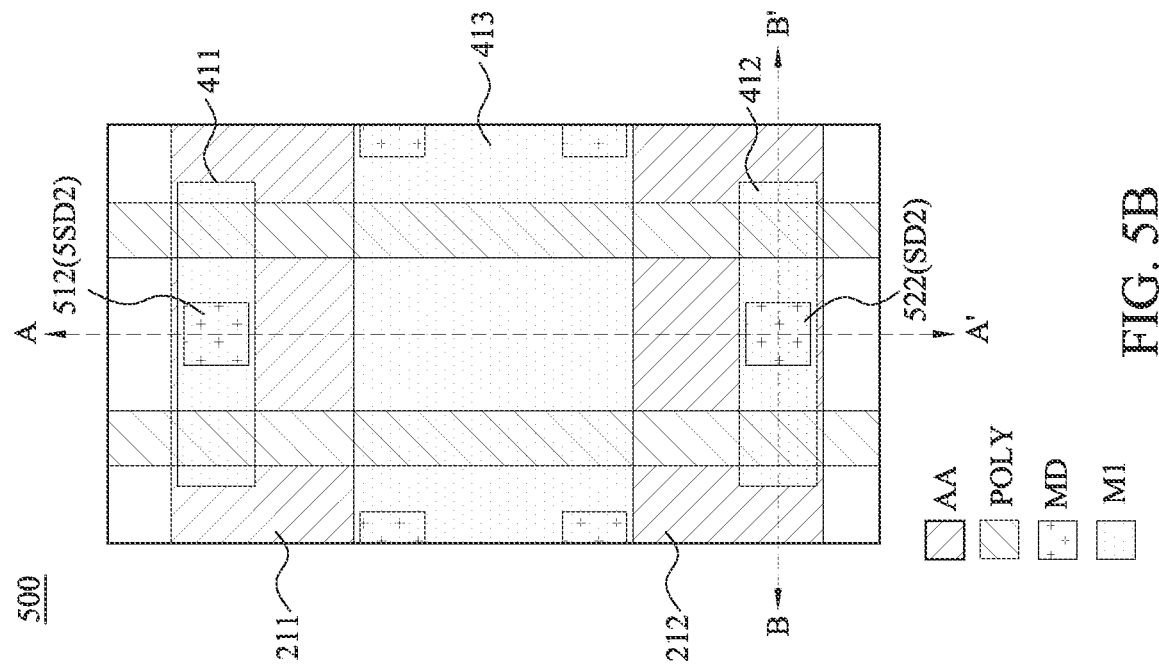
FIGS. 5A-5B are layout diagrams of an OTP memory unit corresponding to the OTP memory unit shown in FIG. 4, in accordance with some embodiments of the present disclosure.
Figure 5A:
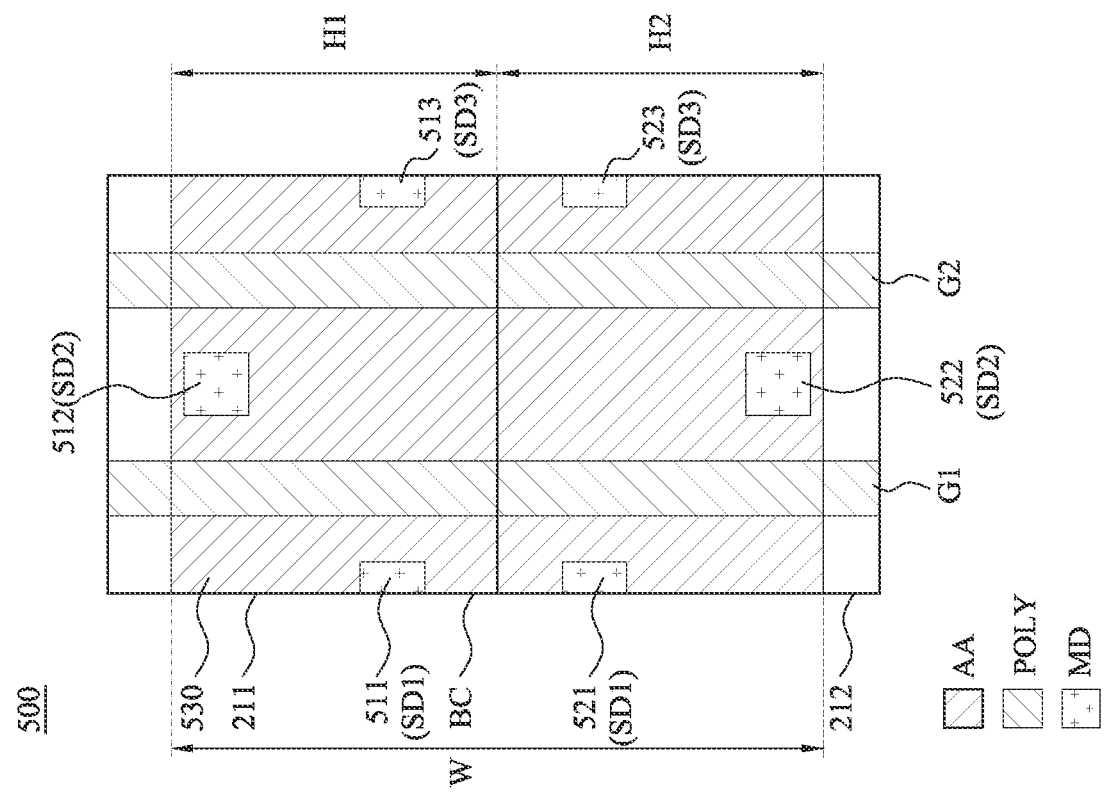

Reference is now made to FIGS. 5A-5B. FIGS. 5A-5B are layout diagrams of an OTP memory unit 500, in accordance with some embodiments of the present disclosure. In some embodiments, the OTP memory unit 500 corresponds to at least one of the OTP memory units 210 illustrated in FIG. 2, the OTP memory unit 300 illustrated in FIG. 3 or the OTP memory unit 400 illustrated in FIG. 4. In various embodiments, the layout diagrams shown in FIGS. 5A-5B are embodiments of the layout diagram of the OTP memory unit 400 shown in FIG. 4, and illustrate the semiconductor structures formed in the active region AA shown in FIG. 4. As such, similar configurations are not further detailed herein. For ease of understanding, the embodiments with respect to FIGS. 5A-5B are discussed with reference to FIGS. 2-4. With respect to the embodiments of FIGS. 2-4, like elements in FIGS. 5A-5B are designated with the same reference numbers for ease of understanding.

As illustrated in FIG. 5A, elements formed within the active region AA in FIG. 4 are illustrated. With reference to FIGS. 2 and 5A, the OTP unit 500 includes the first cell 211 and the second cell 212. Furthermore, in the first cell 211 and the second cell 212, the OTP memory unit 500 includes gates G1-G2 patterned as "POLY", metal segments 511-513 and 521-523 patterned as "MD", and a continuous active region 530 patterned as "AA". In some embodiments, the gates G1-G2 correspond to the gates G1-G2 shown in FIG. 4. In some other embodiments, the metal segments 511-513 and 521-523 are referred to as a metal-like defined (MD) segments hereinafter. In various embodiments, the continuous active region 530 corresponds to the active region AA shown in FIG. 4. For simplicity of illustration, vias coupled to at least one of the gates G1-G2 or the metal segments 511-513 and 521-523 are omitted in FIG. 5A.

The first cell 211 abuts with the second cell 212, and a cell boundary BC is disposed therebetween. The continuous active region 530 includes two parts that are respectively arranged in the first cell 211 and the second cell 212, for forming respective transistors. Alternatively stated, no space is disposed between one part of the continuous active region 530 in the first cell 211 and the other part of the continuous active region 530 in the second cell 212.

In some embodiments, with reference to FIG. 5A, in a layout view, a first active region of the first cell 211 is disposed across the cell boundary, and is overlapped with a part of the second cell 212. Similarly, in a layout view, a second active region of the second cell 212 is disposed across the cell boundary, and is overlapped with a part of the first cell 211. Alternatively stated, the first active region and the second active region are overlapped, in a layout view. As such, the first active region and the second active region form a continuous region that is made of the same material, and is referred to as the continuous active region 530.

The first cell 211 has a cell height H1, and the second cell 212 has a cell height H2, in some embodiments. Therefore, the OTP memory unit 500 has a cell height which is substantially equal to a sum of the cell heights H1 and H2. In some other embodiments, a width of the continuous active region 530 is indicated as a width W. In various embodiments, the width W is greater than at least one of the cell height H1 or H2. In alternative embodiments, the width W is smaller than a cell height of the OTP memory unit 500, which is a sum of the cell heights H1 and H2. In some embodiments, the first cell 211 is identical to the second cell 212, thereby, the cell heights H1 and H2 being the same. As such, the width W is in a range of one cell height of the OTP memory unit 500 to twice of the cell height of the OTP memory unit 500. In various embodiments, the width W is substantially in a range of 0.1 μm to 0.5 μm.

In the first cell 211, gates G1 and G2 are disposed across the continuous active region 530, and the MD segments 511-513 are disposed above a first part of the continuous active region 530. Furthermore, the MD segment 511 is disposed next to the gate G1, the MD segment 512 is disposed between the gates G1 and G2, and the MD segment 513 is disposed next to the gate G2.

In the second cell 212, the MD segments 521-523 are disposed above a second part of the continuous active region 530. Furthermore, the MD segment 521 is disposed next to the gate G1, the MD segment 522 is disposed between the gates G1 and G2, and the MD segment 523 is disposed next to the gate G2.

The gates G1 and G2 correspond to gate terminals of respective transistors, in some embodiments. In some other embodiments, the MD segments 511-513 and 521-523 correspond to source/drain terminals of respective transistors. Specifically, in some embodiments, the gate G1 and the adjacent MD segments 511 and 512 correspond to a first transistor. The gate G2 and the adjacent MD segments 512 and 513 correspond to a second transistor. With such configurations, the second transistor shares one source/drain terminal, corresponding to the MD segment 512, with the first transistor. Alternatively stated, the first transistor and the second transistor are coupled in parallel. As such, an equivalent circuit of the first transistor and the second transistor is one transistor that corresponds to the transistor T1 shown in FIG. 3. In some embodiments, the MD segments 511 and 513 correspond to the source terminal of the transistor T1 shown in FIG. 3, and the MD segment 512 corresponds to the drain terminal of the transistor T1 shown in FIG. 3.

In addition, in some embodiments, the gate G1 and the adjacent MD segments 521 and 522 correspond to a third transistor. The gate G2 and the adjacent MD segments 522 and 523 correspond to a fourth transistor. With such configurations, the third transistor shares one source/drain terminal, corresponding to the MD segment 522, with the fourth transistor. Alternatively stated, the third transistor and the fourth transistor are coupled in parallel. As such, an equivalent circuit of the third transistor and the fourth transistor is one transistor that corresponds to the transistor T2 shown in FIG. 3. In some embodiments, the MD segments 521 and 523 correspond to the source terminal of the transistor T2 shown in FIG. 3, and the MD segment 522 corresponds to the drain terminal of the transistor T2 shown in FIG. 3. Furthermore, with such configurations, the first transistor and the third transistor share the same gate G1, and the second transistor and the fourth transistor share the same gate G2. Therefore, the transistors T1/T2 and T3/T4 share the same gate terminal, which corresponds to the common gates G1/G2 shared by the transistors in the first cell 211 and the transistors in the second cell 212.

The continuous active region 530 is a symbol layer where the semiconductor structures disposed, rather than physical layers, in some embodiments. These semiconductor structures include structure SD1-SD3 shown in FIGS. 6A-6B, and correspond to the semiconductor structures that are formed in the active region AA, as discussed above with reference to FIG. 4. In some embodiments, the continuous active region 530 is implemented by a doped region/area, in order for the formation of the transistors included in the OTP memory unit 500. Since the continuous active region 530 is a continuous region disposed across two adjacent cells 211 and 212 (i.e., the cell boundary BC), a total region of the OTP memory unit 500 is broaden. With such configurations, at least one structure formed in the continuous active region 530 is enlarged, in some embodiments. Also, at least one structure formed in the continuous active region 530 is shared for forming the respective transistors in the first cell 211 and in the second cell 212, in some other embodiments. For example, a structure SD2 (shown in FIGS. 6A-6B), including the MD segments 512 and 522, indicated as a source/drain is formed within the continuous active region 530, which is discussed in detailed with reference to FIGS. 6A-6B.

In some embodiments, the continuous active region 530 is made of the same material including, for example, polysilicon. In some other embodiments, the continuous active region 530 is configured to form channels of transistors. In various embodiments, the continuous active region 530 is made of n-type doped material, for forming NMOS transistors which correspond to the transistors T1 and T2 shown in FIG. 3.

The configurations of the continuous active region 530 shown in FIGS. 5A-5B are given for illustrative purposes. Various configurations of the continuous active region 530 to implement the OTP memory unit 500 illustrated in FIGS.

5A-5B are within the contemplated scope of the present disclosure. For example, in some embodiments, the continuous active region 530 is made of p-type doped material. In alternative embodiments, the continuous active region 530 is configured to form fin structures, for forming fin field-effect transistors (FinFETs).

In some embodiments, the gates G1 and G2 are polysilicon gates. In some embodiments, the MD segments 511-513 and 521-523 include a portion of at least one metal layer, e.g., one or more of copper (Cu), silver (Ag), tungsten (W), titanium (Ti), nickel (Ni), tin (Sn), aluminum (Al) or another metal or material suitable for providing a low resistance electrical connection between elements included in a memory device included in an integrated circuit (IC), i.e., a resistance level below a predetermined threshold corresponding to one or more tolerance levels of a resistance-based effect on circuit performance. In some other embodiments, the MD segments 511-513 and 521-523 include a section of the semiconductor substrate and/or an epitaxial layer having a doping level, e.g., based on an implantation process, sufficient to cause the segment to have the low resistance level. In various embodiments, doped MD segments 511-513 and 521-523 include one or more of silicon (Si), SiGe, silicon-carbide (SiC), boron (B), phosphorous (P), arsenic (As), gallium (Ga), a metal as discussed above, or another material suitable for providing the low resistance level. In some embodiments, MD segments 511-513 and 521-523 include a dopant having a doping concentration of about $1*10^{16}$ per cubic centimeter ($cm^{-3}$) or greater.

As illustrated in FIG. 5B, elements formed within the active region AA and the metal layer M1 in FIG. 4 are illustrated. For simplicity of illustration, only few elements are labeled in FIG. 5B. Compared to FIG. 5A, in the first cell 211 and the second cell 212, the OTP memory unit 500 in FIG. 5B further includes the metal segments 411, 412 and 413. The metal segments 411-413 are formed in the metal layer M1, and respectively correspond to the metal segments 411-413 shown in FIG. 4. Also, for simplicity of illustration, vias coupled to at least one of the metal segments 411-413 are omitted in FIG. 5B.

The metal segment 411 is arranged in the first cell 211. In a layout view, the metal segment 411 is overlapped with the MD segment 512, and is intersected with the gates G1 and G2 (labeled in FIG. 5A). The metal segment 411 is coupled to the MD segment 512, in some embodiments. The metal segment 412 is arranged in the second cell 212. In a layout view, the metal segment 412 is overlapped with the MD segment 522, and is intersected with the gates G1 and G2 (labeled in FIG. 5A). The metal segment 412 is coupled to the MD segment 522, in some embodiments.

In addition, the metal segment 413 is arranged across the first cell 211 and the second cell 212. In a layout view, the metal segment 413 is overlapped with the cell boundary BC (labeled in FIG. 5A). In addition, in a layout view, the metal segment 413 is overlapped with the MD segments 511, 513, 521 and 523 (labeled in FIG. 5A), and is intersected with the gates G1 and G2 (labeled in FIG. 5A). The metal segment 413 couple the MD segments 511, 513, 521 and 523 together, in some embodiments, which corresponding to the source terminals of the transistors T1 and T2 being coupled together shown in FIG. 3.

In some approaches, one OTP memory unit of a memory device includes at least three cells. An equivalent circuit of such OTP memory unit includes at least three transistors that are coupled in parallel. As such, a layout diagram of the OTP memory unit includes at least three cells. These three cells are arranged horizontally to share the same cell height, and are separated from other OTP memory unit by at least one isolation structure including, for example, a shallow trench isolation (STI). Therefore, additional metal rails are formed in metal layers to couple semiconductor structures together. These semiconductor structures are independent from one another and correspond to a common terminal of the transistors.

Figures 6A, 6B:
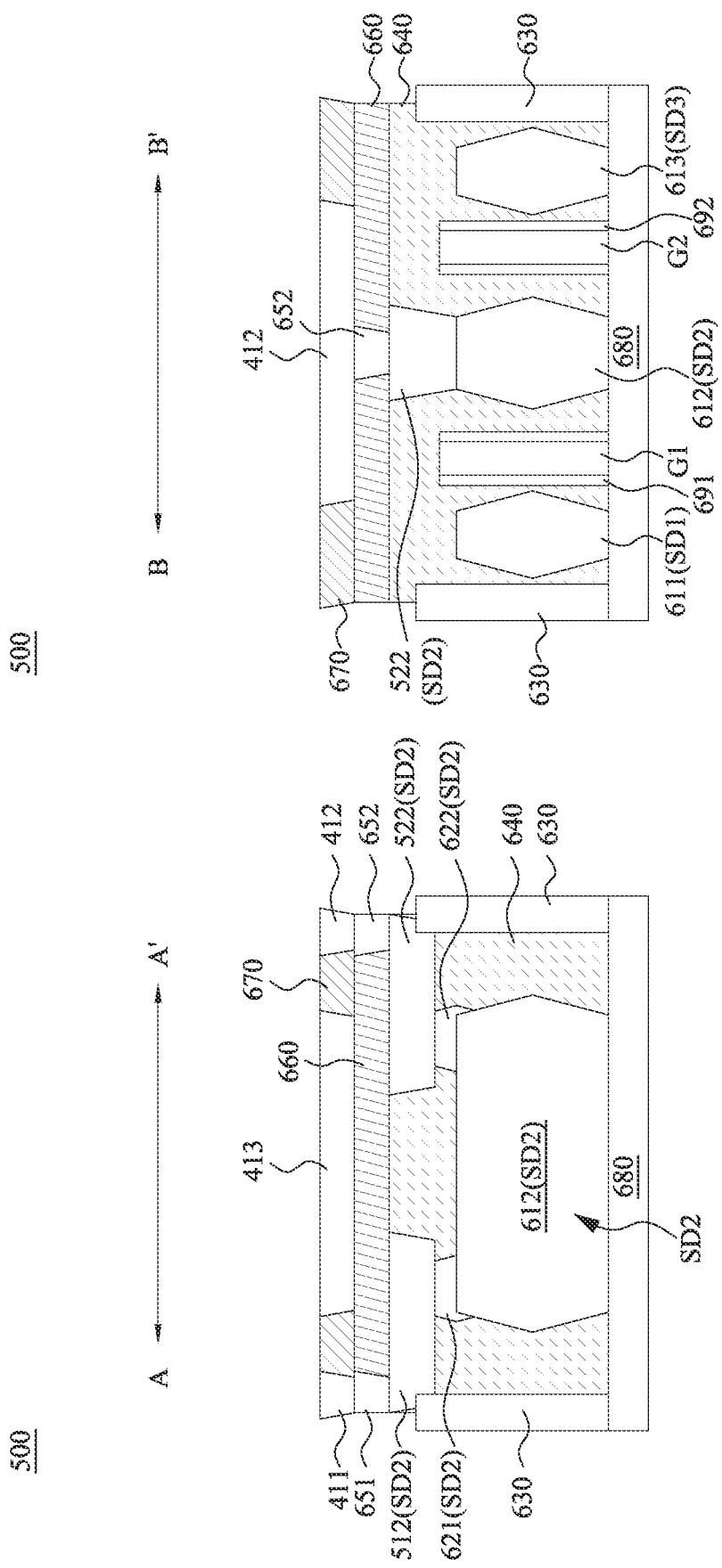
FIGS. 6A-6B are cross sectional view of an OTP memory unit corresponding to the OTP memory unit in FIG. 5B, in accordance with some embodiments of the present disclosure.

Compared to the above approaches, in the embodiments of the present disclosure, for example with reference to FIGS. 5A-5B, in two adjacent cells 211 and 212 of the OTP memory unit 500, the continuous active region 530 is bridged by respective active areas (not shown) in the adjacent cells 211 and 212, as one common active region, for forming the structure SD2 (shown in FIG. 6A). The structure SD2 corresponds to a common drain of the transistors T1-T2 shown in FIG. 3. As such, no additional metal segments are formed in the metal layers M1-M5 for connecting the MD segments 512 and 522 of the structure SD2 together. Accordingly, the total area of the layout diagram is reduced, and a cost for fabricating the memory device including the OTP memory unit 500 is also reduced.

Reference is now made to FIGS. 6A-6B. FIGS. 6A-6B are cross sectional view of the OTP memory unit 500 shown in FIG. 5B, in accordance with some embodiments of the present disclosure. FIG. 6A is a cross-sectional view along a line A-A' of FIG. 5B. FIG. 6B is a cross-sectional view along a line B-B' of FIG. 5B. For ease of understanding, the embodiments with respect to FIGS. 6A-6B are discussed with reference to FIGS. 3-5B, and only some elements that are associated with the corresponding elements are illustrated in FIGS. 6A-6B as an exemplary embodiment. With respect to the embodiments of FIGS. 5A-5B, like elements in FIGS. 6A-6B are designated with the same reference numbers for ease of understanding.

As illustrated in FIG. 6A, a structure SD2 is disposed, and includes the MD segments 512 and 522, an epitaxy structure 612 and silicide layers 621-622. Both of the MD segments 512 and 522 are disposed on the epitaxy structure 612, and the silicide layers 621 and 622 are respectively disposed over therebetween. The epitaxy structure 612 and the silicide layers 621-622 are disposed between isolation structures 630. A dielectric structure 640 is filled between the MD segments 512 and 522, the epitaxy structure 612 and the isolation structures 630.

In some embodiments, the epitaxy structure 612 corresponds to the continuous active region 530 illustrated in FIGS. 5A-5B. In some other embodiments, the epitaxy structure 612 corresponds to the drain structure of the first to the fourth transistors, as discussed above with reference to FIGS. 5A-5B. With such configurations, the MD segments 512 and 522 are coupled together through the epitaxy structure 612, which corresponds to the drain terminals of the transistors T1 and T2 being coupled at the node N1 illustrated in FIG. 3.

In the programming or the reading operation, in some embodiments, with reference to FIGS. 3-4 and 6A, when the transistors T1 and T2 are activated, the second programming voltage (which is discussed above with reference to FIGS. 3-4) is provided from the MD segment 512 through the epitaxy structure 612 to the MD segment 522. That is, the MD segment 512 receives the second programming voltage, and couples the second programming voltage through the epitaxy structure 612 to the MD segment 522. Alternatively stated, the MD segments 512 and 522 are coupled together, without additional metal segments, which corresponds to the drain terminals of the transistors T1 and T2 being coupled together. It further corresponds to the current path P2 shown in FIG. 4.

In some other embodiments, the epitaxy structure 612 includes Ge, Si, GaAs, AlGaAs, SiGe, GaAsP, SiP, or other suitable material.

In some embodiments, the silicide layers 621-622 cover tops of the epitaxy structure 612. In some other embodiments, the silicide layers 621-622 are embedded in the epitaxy structure 612. In various embodiments, the silicide layers 621-622 include $CoSi_2$, $TiSi_2$, $WSi_2$, $NiSi_2$, $MoSi_2$, $TaSi_2$, PtSi, or the like.

In some embodiments, the isolation structures 630 are shallow trench isolation (STI) structures, suitable isolation structures, combinations thereof or the like. In some other embodiments, the isolation structures 630 are made of oxide (e.g., silicon oxide) or nitride (e.g., silicon nitride).

In some embodiments, the dielectric structure 640 is made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials.

An interlayer dielectric (ILD) layer 660 is disposed above the MD segments 512 and 522 and the dielectric structure 640. Furthermore, the ILD layer is filled between vias 651 and 652 which are indicated as VD vias hereinafter. A dielectric structure 670 is filled between the metal segments 411-413, and is also indicated as the M1 layer in some embodiments. The VD via 651 is disposed above between MD segment 512 and the metal segment 411. The VD via 652 is disposed above between MD segment 522 and the metal segment 412. Another ILD layer 680 is disposed below the epitaxy structure 612, the isolation structures 630 and the dielectric structure 640.

The MD segment 512 is coupled through the VD via 651 to the metal segment 411, in some embodiments. In some other embodiments, the MD segment 522 is coupled through the VD via 652 to the metal segment 412. In various embodiments, since the MD segments 512 and 522 are coupled together through the epitaxy structure 612, in the OTP memory unit 500, no additional metal segments/tracks/blocks/rails that are disposed above the M1 layer and contact the metal segments 411 and 412, for coupling the corresponding MD segments 512 and 522 together.

In some embodiments, the ILD layer 660 includes silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide.

In some embodiments, the dielectric structure 670 corresponds to the dielectric structure 640 shown in FIG. 6A. In some other embodiments, the ILD layer 680 corresponds to the ILD layer 660 shown in FIG. 6A.

Compared to FIG. 6A, in the cross sectional view of the OTP memory unit 500 shown in FIG. 6B, the MD segment 522 and the epitaxy structure 612 of the structure SD2 are disposed between the gates G1 and G2. An epitaxy structure 611 of a structure SD1 is disposed between the isolation structure 630 and the gate G1, and an epitaxy structure 611 of a structure SD3 is disposed between the gate G2 and the isolation structure 630. A spacer 691 is disposed on opposite sidewalls of the gate G1, and a spacer 692 is disposed on opposite sidewalls of the gate G2.

In some embodiments, the spacers 691-692 include $SiO_2$, $Si_3N_4$, $SiO_xN_y$, SiC, SiCN films, SiOC, SiOCN films, and/or combinations thereof.

Figure 7:
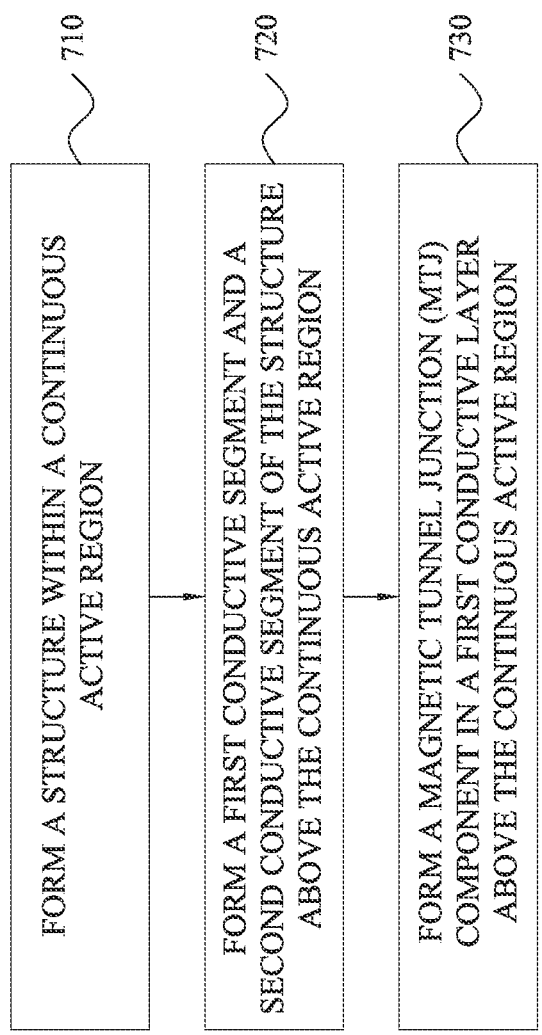
FIG. 7 is a flow chart of a method for fabricating a memory device corresponding to the memory device in FIG. 1, in accordance with some embodiments of the present disclosure.

Reference is now made to FIG. 7. FIG. 7 is a flow chart of a method 700 for fabricating a memory device, in accordance with some embodiments of the present disclosure. In some embodiments, the memory device corresponds to the memory device 200 shown in FIG. 2. In some other embodiments, the memory device includes at least one OTP memory unit including, for example, the OTP memory unit 210, 300, 400 or 500 shown in FIGS. 2-6B. In some other embodiments, the memory device is manufactured based on at least one layout diagram including, for example, layout diagrams discussed above with respect to FIGS. 2, 4-6B. Following illustrations of the method 700 in FIG. 7 with reference to the OTP memory unit 400 shown in FIG. 4 and the OTP memory unit 500 shown in FIGS. 5A-6B thereof include exemplary operations. However, the operations in FIG. 7 are not necessarily performed in the order shown. Alternatively stated, operations may be added, replaced, changed order, and/or eliminated as appropriate, in accordance with the spirit and scope of various embodiments of the present disclosure.

The method 700 is includes the operations 710-730. The operations 710-730 discussed below are for one OTP memory unit of the memory device. For illustration, as shown in FIG. 2, one of the OTP memory units 210 of the memory device 200 is fabricated. In various embodiments, such OTP memory unit 210 is disposed next to one memory unit 221, and is implemented by the OTP memory unit 400 in FIG. 4 and the OTP memory unit 500 in FIGS. 5A-6B.

In the operation 710, a structure is formed within a continuous active region. For illustration, as shown in FIGS. 5A-6B, the structure SD2 is formed within the continuous active region 530.

In the operation 720, a first metal segment and a second metal segment of the structure is formed above the continuous active region. For illustration, as shown in FIGS. 5A-6B, the MD segment 522 and the MD segment 512 of the structure SD2 is formed above the continuous active region 530.

The first metal segment corresponds to a first source/drain terminal of a first transistor, in some embodiments. For illustration, as shown in FIG. 5A, the MD segment 522 corresponds to the drain terminal of the transistor T2 shown in FIG. 3.

The second metal segment is separated from the first metal segment, and corresponds to a first source/drain terminal of a second transistor, in some embodiments. For illustration, as shown in FIG. 5A, the MD segment 512 is separated from the MD segment 522, and corresponds to the drain terminal of the transistor T1 shown in FIG. 3.

In the operation 730, a magnetic tunnel junction (MTJ) component is formed in a metal layer above the continuous active region. For illustration, as shown in FIG. 4, the MTJ component R12 is formed in the metal layer M3, and the metal layer M3 is disposed above the active region AA. The active region AA is implemented by the continuous active region 530 shown in FIGS. 5A-5B, in some embodiments.

The MTJ component is coupled to the first and the second metal segments of the structure, in some embodiments. For illustration, as shown in FIG. 4, the MTJ component R12 is coupled through the current path P1 to the transistors that are formed in the active region AA. These transistors are implemented by transistors that include the structure SD2 shown in FIGS. 6A-6B, in some embodiments. With reference to FIGS. 4 and 6A, the MD segments 522 and 512 of the structure SD2 are coupled together, which corresponds to the current path P2.

Figure 8:
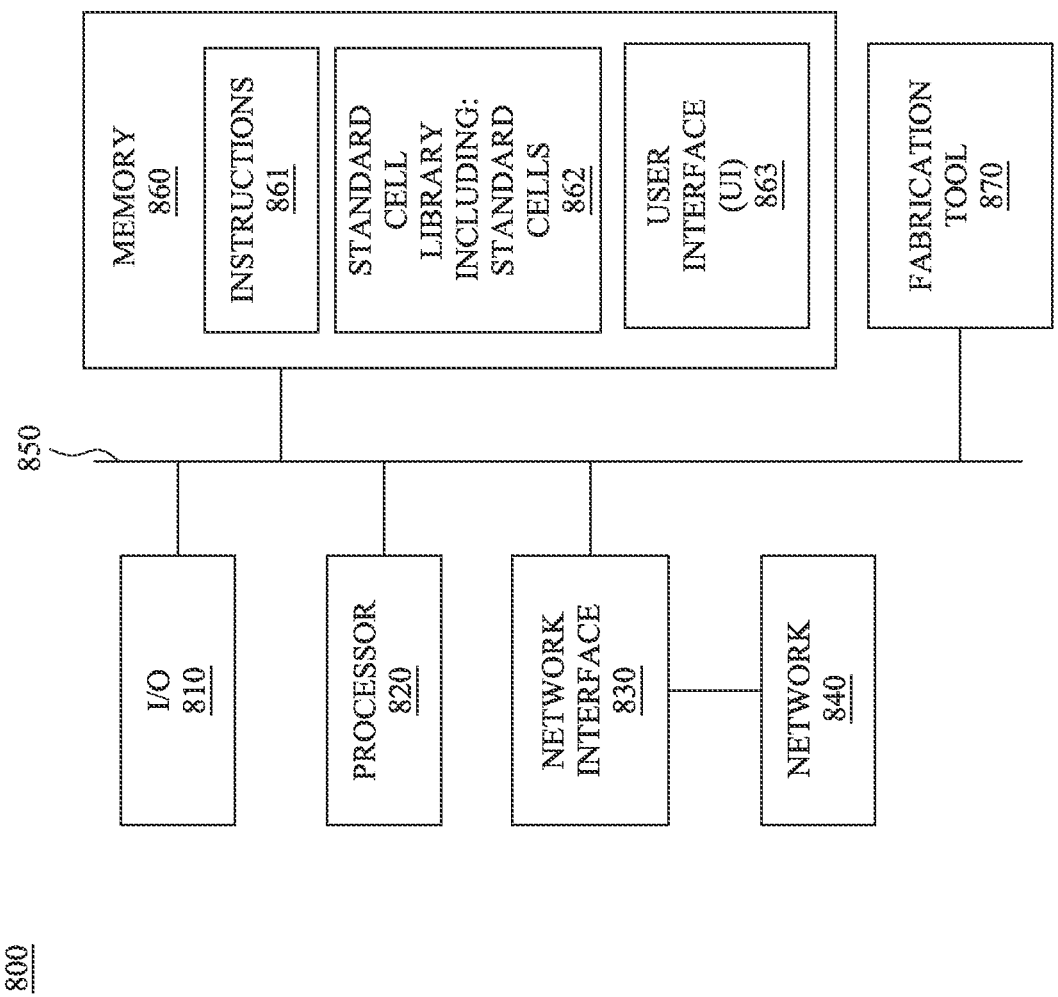
FIG. 8 is a block diagram of a system for designing an integrated circuit (IC) layout design, in accordance with some embodiments of the present disclosure.

Reference is now made to FIG. 8. FIG. 8 is a block diagram of an electronic design automation (EDA) system 800 for designing the integrated circuit layout design, in accordance with some embodiments of the present disclosure. EDA system 800 is configured to implement one or more operations of the method 700 disclosed in FIG. 7, and further explained in conjunction with FIGS. 2-6B. In some embodiments, EDA system 800 includes an APR system.

In some embodiments, EDA system 800 is a general purpose computing device including a hardware processor 820 and a non-transitory, computer-readable storage medium 860. Storage medium (i.e., memory) 860, amongst other things, is encoded with, i.e., stores, computer program code (instructions) 861, i.e., a set of executable instructions. Execution of instructions 861 by hardware processor 820 represents (at least in part) an EDA tool which implements a portion or all of, e.g., the method 700.

The processor 820 is electrically coupled to computer-readable storage medium 860 via a bus 850. The processor 820 is also electrically coupled to an input/output (I/O) interface 810 and a fabrication tool 870 by bus 850. A network interface 830 is also electrically connected to processor 820 via bus 850. Network interface 830 is connected to a network 840, so that processor 820 and computer-readable storage medium 860 are capable of connecting to external elements via network 840. The processor 820 is configured to execute computer program code 861 encoded in computer-readable storage medium 860 in order to cause EDA system 800 to be usable for performing a portion or all of the noted processes and/or methods. In one or more embodiments, processor 820 is a central processing unit (CPU), a multi-processor, a distributed processing system, an application specific integrated circuit (ASIC), and/or a suitable processing unit.

In one or more embodiments, computer-readable storage medium 860 is an electronic, magnetic, optical, electromagnetic, infrared, and/or a semiconductor system (or apparatus or device). For example, computer-readable storage medium 860 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 860 includes a compact disk-read only memory (CD-ROM), a compact disk-read/write (CD-R/W), and/or a digital video disc (DVD).

In one or more embodiments, storage medium 860 stores computer program code 861 configured to cause EDA system 800 (where such execution represents (at least in part) the EDA tool) to be usable for performing a portion or all of the noted processes and/or methods. In one or more embodiments, storage medium 860 also stores information which facilitates performing a portion or all of the noted processes and/or methods. In one or more embodiments, storage medium 860 stores library 862 of standard cells including such standard cells as disclosed herein, for example, the first cell 211 and the second cell 212 discussed above with respect to FIG. 2.

EDA system 800 includes I/O interface 810. I/O interface 810 is coupled to external circuitry. In one or more embodiments, I/O interface 810 includes a keyboard, keypad, mouse, trackball, trackpad, touchscreen, and/or cursor direction keys for communicating information and commands to processor 820.

EDA system 800 also includes network interface 830 coupled to processor 820. Network interface 830 allows EDA system 800 to communicate with network 840, to which one or more other computer systems are connected. Network interface 830 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EDA systems 800.

EDA system 800 also includes the fabrication tool 870 coupled to the processor 820. The fabrication tool 870 is configured to fabricate integrated circuits, including, for example, the memory device 100 illustrated in FIG. 1 or the memory device 200 illustrated in FIG. 2, based on the design files processed by the processor 820 and/or the IC layout designs as discussed above.

EDA system 800 is configured to receive information through I/O interface 810. The information received through I/O interface 810 includes one or more of instructions, data, design rules, libraries of standard cells, and/or other parameters for processing by processor 820. The information is transferred to processor 820 via bus 850. EDA system 800 is configured to receive information related to a UI through I/O interface 810. The information is stored in computer-readable medium 860 as user interface (UI) 863.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 800. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 9:
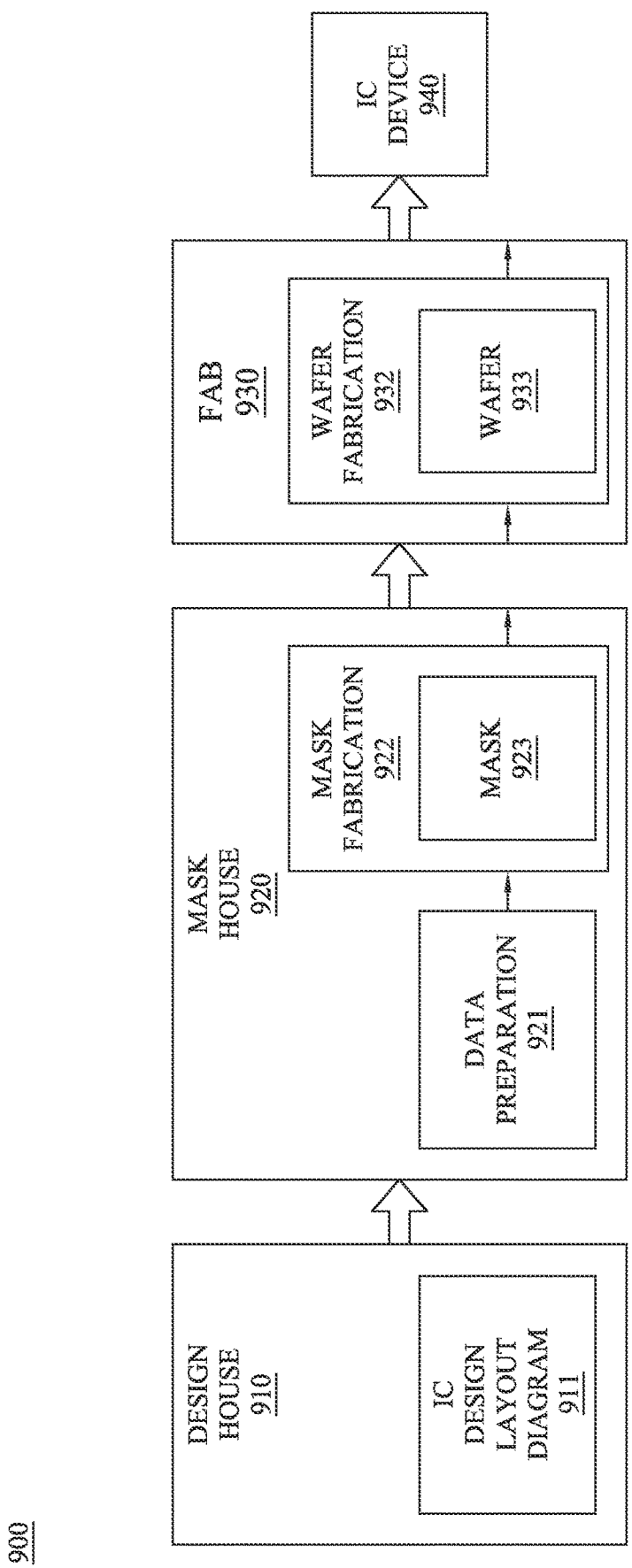
FIG. 9 is a block diagram of an IC manufacturing system, and an IC manufacturing flow associated therewith, in accordance with some embodiments.

FIG. 9 is a block diagram of IC manufacturing system 900, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 900.

In FIG. 9, IC manufacturing system 900 includes entities, such as a design house 910, a mask house 920, and an IC manufacturer/fabricator ("fab") 930, that interact with one another in the design, development, and manufacturing cycles and/or services related to manufacturing an IC device 940. The entities in IC manufacturing system 900 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 910, mask house 920, and IC fab 930 is owned by a single larger company. In some embodiments, two or more of design house 910, mask house 920, and IC fab 930 coexist in a common facility and use common resources.

Design house (or design team) 910 generates an IC design layout diagram 911. IC design layout diagram 911 includes various geometrical patterns, for example, the layout design depicted in FIGS. 2, 4 and/or FIGS. 5A-6B, designed for an IC device 940, for example, integrated circuits including the memory device 100 and 200, discussed above with respect to FIG. 1, and/or FIG. 2. The geometrical patterns correspond to patterns of metal, oxide, or semiconductor layers that make up the various components of IC device 940 to be fabricated. The various layers combine to form various IC features. For example, a portion of IC design layout diagram 911 includes various IC features, such as an active region, gate electrode, source and drain, conductive segments or vias of an interlayer interconnection, to be formed in a semiconductor substrate (such as a silicon wafer) and various material layers disposed on the semiconductor substrate. Design house 910 implements a proper design procedure to form IC design layout diagram 911. The design procedure includes one or more of logic design, physical design or place and route. IC design layout diagram 911 is presented in one or more data files having information of the geometrical patterns. For example, IC design layout diagram 911 can be expressed in a GDSII file format or DFII file format.

Mask house 920 includes mask data preparation 921 and mask fabrication 922. Mask house 920 uses IC design layout diagram 911 to manufacture one or more masks 923 to be used for fabricating the various layers of IC device 940 according to IC design layout diagram 911. Mask house 920 performs mask data preparation 921, where IC design layout diagram 911 is translated into a representative data file ("RDF"). Mask data preparation 921 provides the RDF to mask fabrication 922. Mask fabrication 922 includes a mask writer. A mask writer converts the RDF to an image on a substrate, such as a mask (reticle) 923 or a semiconductor wafer 933. The IC design layout diagram 911 is manipulated by mask data preparation 921 to comply with particular characteristics of the mask writer and/or requirements of IC fab 930. In FIG. 9, data preparation 921 and mask fabrication 922 are illustrated as separate elements. In some embodiments, data preparation 921 and mask fabrication 922 can be collectively referred to as mask data preparation.

In some embodiments, data preparation 921 includes optical proximity correction (OPC) which uses lithography enhancement techniques to compensate for image errors, such as those that can arise from diffraction, interference, other process effects and the like. OPC adjusts IC design layout diagram 911. In some embodiments, data preparation 921 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, data preparation 921 includes a mask rule checker (MRC) that checks the IC design layout diagram 911 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 911 to compensate for limitations during mask fabrication 922, which may undo part of the modifications performed by OPC in order to meet mask creation rules.

In some embodiments, data preparation 921 includes lithography process checking (LPC) that simulates processing that will be implemented by IC fab 930 to fabricate IC device 940. LPC simulates this processing based on IC design layout diagram 911 to create a simulated manufactured device, such as IC device 940. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 911.

It should be understood that the above description of data preparation 921 has been simplified for the purposes of clarity. In some embodiments, data preparation 921 includes additional features such as a logic operation (LOP) to modify the IC design layout diagram 911 according to manufacturing rules. Additionally, the processes applied to IC design layout diagram 911 during data preparation 921 may be executed in a variety of different orders.

After data preparation 921 and during mask fabrication 922, a mask 923 or a group of masks 923 are fabricated based on the modified IC design layout diagram 911. In some embodiments, mask fabrication 922 includes performing one or more lithographic exposures based on IC design layout diagram 911. In some embodiments, an electron-beam (e-beam) or a mechanism of multiple e-beams is used to form a pattern on a mask (photomask or reticle) 923 based on the modified IC design layout diagram 911. Mask 923 can be formed in various technologies. In some embodiments, mask 923 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of mask 923 includes a transparent substrate (for example, fused quartz) and an opaque material (for example, chromium) coated in the opaque regions of the binary mask. In another example, mask 923 is formed using a phase shift technology. In a phase shift mask (PSM) version of mask 923, various features in the pattern formed on the phase shift mask are configured to have proper phase difference to enhance the resolution and imaging quality. In various examples, the phase shift mask can be attenuated PSM or alternating PSM. The mask(s) generated by mask fabrication 922 is used in a variety of processes. For example, such a mask(s) is used in an ion implantation process to form various doped regions in semiconductor wafer 933, in an etching process to form various etching regions in semiconductor wafer 933, and/or in other suitable processes.

IC fab 930 includes wafer fabrication 932. IC fab 930 is an IC fabrication business that includes one or more manufacturing facilities for the fabrication of a variety of different IC products. In some embodiments, IC Fab 930 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 930 uses mask(s) 923 fabricated by mask house 920 to fabricate IC device 940. Thus, IC fab 930 at least indirectly uses IC design layout diagram 911 to fabricate IC device 940. In some embodiments, semiconductor wafer 933 is fabricated by IC fab 930 using mask(s) 923 to form IC device 940. In some embodiments, the IC fabrication includes performing one or more lithographic exposures based at least indirectly on IC design layout diagram 911. Semiconductor wafer 933 includes a silicon substrate or other proper substrate having material layers formed thereon. Semiconductor wafer 933 further includes one or more of various doped regions, dielectric features, multilevel interconnects, and the like (formed at subsequent manufacturing steps).

In some embodiments, a memory device is disclosed. The memory device includes an one-time-programmable (OTP) memory unit. The OTP memory unit includes a first gate, a first conductive segment and a second conductive segment of a first structure, and a first magnetic tunnel junction (MTJ) component. The first gate is formed across an active region, and corresponds to gate terminals of a first transistor and a second transistor. The first conductive segment and the second conductive segment of the first structure are formed above the active region, and correspond to a first source/drain terminal of the first transistor and a first source/drain terminal of the second transistor, respectively. The first MTJ component is formed in a first conductive layer above the active region, and is coupled to the first conductive segment and the second conductive segment for receiving a programming signal from a data line.

In some embodiments, the OTP memory unit further includes a second gate. The second gate is formed across the active region and is disposed next to the first gate. The first gate and the second gate are coupled together for receiving a selecting signal from a word line. The first conductive segment and the second conductive segment of the first structure are disposed between the first gate and the second gate, in a layout view.

In some embodiments, the OTP memory unit further includes a third conductive segment of a second structure. The third conductive segment of the second structure is formed above the active region, and corresponds to a second source/drain terminal of the first transistor. The first structure and the second structure have widths that are substantially the same.

In some embodiments, the OTP memory unit further includes a plurality of third conductive segments and a via. The plurality of third conductive segments are separated from each other. The plurality of third conductive segments are formed in a second conductive layer between the first conductive layer and the active region. The via is formed between the second conductive layer and the active region, to couple a fourth conductive segment of the plurality of third conductive segments to the first conductive segment, for transmitting the programming signal. The plurality of third conductive segments, excluding the fourth conductive segment, have no programming signal transmitting therebetween.

In some embodiments, the OTP memory unit further includes at least one second MTJ component. The at least one second MTJ component is formed in the first conductive layer and is separated from the first MTJ component. The at least one second MTJ component is electrically floating.

In some embodiments, in at least two adjacent cells of the OTP memory unit, the first gate, the active region and the first structure extend in the same direction. In the at least two adjacent cells of the OTP memory unit, the active region extends across at least one cell boundary of the at least two adjacent cells.

In some embodiments, the OTP memory unit further includes a memory unit. The memory unit is disposed next to the OTP memory unit. The memory unit includes a second MTJ component. The second MTJ component is formed in the first conductive layer and is coupled to the data line that is coupled to the first MTJ component.

In some embodiments, a memory device is disclosed. The memory device includes two adjacent cells of an one-time-programmable (OTP) memory array that is disposed next to a memory array. The two adjacent cells of the OTP memory array includes a continuous active region, a first conductive segment, a second conductive segment, and a first magnetic tunnel junction (MTJ) component. The continuous active region is disposed across a cell boundary between the two adjacent cells. The first conductive segment is formed above the continuous active region and is disposed between two adjacent gates. The second conductive segment is formed above the continuous active region and is disposed between the two adjacent gates. The first MTJ component is formed in a first conductive layer above the continuous active region. The first conductive segment and the second conductive segment correspond to first source/drain terminals of a first transistor and a second transistor respectively, and are together coupled to the first MTJ component.

In some embodiments, the two adjacent cells of the OTP memory array further include an epitaxy structure. The epitaxy structure is formed within the continuous active region, and is disposed across the cell boundary and between the two adjacent gates. The first conductive segment and the second conductive segment are disposed above the epitaxy structure.

In some embodiments, the two adjacent cells of the OTP memory array further include a third conductive segment. The third conductive segment is formed above the continuous active region, and is disposed outside the two adjacent gates. The third conductive segment corresponds to a second source/drain terminal of the first transistor. In a programming operation, the third conductive segment is configured to receive a first voltage, and the first conductive segment is configured to receive a second voltage from a word line, and to couple the second voltage to the second conductive segment.

In some embodiments, the two adjacent cells of the OTP memory array further include a second MTJ component. The second MTJ component is formed in the first conductive layer and is separated from the first MTJ component. In a programming operation, the second MTJ component is electrically floating, and the first MTJ component is coupled to the first conductive segment and the second conductive segment, for writing a bit data into the first MTJ component.

In some embodiments, the two adjacent cells of the OTP memory array further include a third conductive segment and a fourth conductive segment, and a via. The third conductive segment and the fourth conductive segment are formed in a second conductive layer between the first conductive layer and the continuous active region. In a layout view, the third conductive segment is overlapped with the second MTJ component, and the fourth conductive segment is overlapped with the first MTJ component. The via is formed between the second conductive layer and the continuous active region, to couple the fourth conductive segment to the first conductive segment.

In some embodiments, the two adjacent cells of the OTP memory array further include a first conductive rail and a second conductive rail. The first conductive rail is formed in the first conductive layer and is separated from the first MTJ component. The second conductive rail is formed in a second conductive layer between the first conductive layer and the continuous active region. The first conductive rail and the second conductive rail are configured to couple a voltage to the two adjacent gates that correspond to gate terminals of the first transistor and the second transistor, for activating the first transistor and the second transistor.

In some embodiments, the two adjacent cells of the OTP memory array further include a third conductive rail. The third conductive rail is formed above the first conductive layer, and is coupled to at least one memory cell of the memory array. In a programming operation, the third conductive rail is configured to couple a voltage to the first conductive segment, the second conductive segment and the first MTJ component, for changing a ferromagnetic state of the first MTJ component.

In some embodiments, a width of each one of the two adjacent cells is a cell height. A width of the continuous active region is in a range of the cell height to twice of the cell height.

In some embodiments, a method for fabricating a memory device is disclosed. The method device includes the following operations. In an one-time-programmable (OTP) memory unit disposed next to a memory unit, a structure is formed within a continuous active region, a first conductive segment and a second conductive segment of the structure is formed above the continuous active region, and a first magnetic tunnel junction (MTJ) component is formed in a first conductive layer above the continuous active region. The first conductive segment and the second conductive segment are separated from each other, and correspond to a first source/drain terminal of a first transistor and a first source/drain terminal of a second transistor, respectively. The first conductive segment and the second conductive segment are coupled together to the first MTJ component.

In some embodiments, the method further includes the following operations. In the OTP memory unit, a second MTJ component is formed in the first conductive layer. In a layout view, the first MTJ component is overlapped with the first conductive segment, and the second MTJ component is overlapped with the second conductive segment. The second MTJ component is electrically floating.

In some embodiments, the method further includes the following operations. In the OTP memory unit, a plurality of third conductive segments, which are separated from each other, are formed in a second conductive layer between the first conductive layer and the continuous active region. A third conductive segment of the plurality of third conductive segments is configured to couple the second MTJ component to be floating. A fourth conductive segment of the plurality of third conductive segments is configured to couple the first MTJ component to the first conductive segment.

In some embodiments, the method further includes the following operations. In the OTP memory unit, at least two gates are formed across the continuous active region. In a layout view, the first conductive segment and the second conductive segment are disposed between the at least two gates.

In some embodiments, the method further includes the following operations. In the OTP memory unit, a third conductive segment is formed above the continuous active region. The third conductive segment corresponds to a second source/drain terminal of the first transistor. In a programming operation, the third conductive segment is configured to receive a first voltage, and the first conductive segment is configured to receive a second voltage, and to couple the second voltage to the second conductive segment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a memory device, comprising:
   in an one-time-programmable (OTP) memory unit disposed next to a memory unit,
   forming a structure within a continuous active region;
   forming a first conductive segment of the structure and a second conductive segment of the structure above the continuous active region; and
   forming a first magnetic tunnel junction (MTJ) component in a first conductive layer above the continuous active region and below the first conductive segment,
   wherein the first conductive segment and the second conductive segment are separated from each other and correspond to a first source/drain terminal of a first transistor and a first source/drain terminal of a second transistor, respectively, and are coupled to the first MTJ component.

2. The method of claim 1, further comprising:
   in the OTP memory unit,
   forming a second MTJ component in the first conductive layer,
   wherein in a layout view, the first MTJ component is overlapped with the first conductive segment, and the second MTJ component is overlapped with the second conductive segment, and
   the second MTJ component is electrically floating.

3. The method of claim 2, further comprising:
   in the OTP memory unit,
   forming a plurality of third conductive segments that are separated from each other in a second conductive layer between the first conductive layer and the continuous active region,
   wherein a third conductive segment of the plurality of third conductive segments is configured to couple the second MTJ component to be floating, and a fourth conductive segment of the plurality of third conductive segments is configured to couple the first MTJ component to the first conductive segment.

4. The method of claim 1, further comprising:
in the OTP memory unit,
forming at least two gates across the continuous active region,
wherein in a layout view, the first conductive segment and the second conductive segment are disposed between the at least two gates.

5. The method of claim 1, further comprising:
in the OTP memory unit,
forming a third conductive segment above the continuous active region,
wherein the third conductive segment corresponds to a second source/drain terminal of the first transistor, and
in a programming operation, the third conductive segment is configured to receive a first voltage, and the first conductive segment is configured to receive a second voltage, and to couple the second voltage to the second conductive segment.

6. A method, comprising:
in an one-time-programmable (OTP) memory unit disposed next to a first memory unit,
forming a first structure within a continuous active region;
forming a first conductive segment and a second conductive segment of the first structure above the continuous active region, corresponding to a first source/drain terminal of a first transistor and a first source/drain terminal of a second transistor, respectively; and
forming a first magnetic tunnel junction (MTJ) component in a first conductive layer above the continuous active region and below the first conductive segment and the second conductive segment for receiving a programming signal from a data line,
wherein the first conductive segment and the second conductive segment are separated from each other, and are coupled to the first MTJ component.

7. The method of claim 6, wherein forming the OTP memory unit further comprises:
forming a second structure within the active region and aligned to the first structure along a direction that a first gate extends,
wherein the first conductive segment and the second conductive segment of the first structure are disposed between the first gate and a second gate, in a layout view.

8. The method of claim 7, wherein forming the OTP memory unit further comprises:
forming a third conductive segment above the active region, and corresponding to a second source/drain terminal of the first transistor,
wherein the first structure and the second structure have widths that are substantially the same.

9. The method of claim 6, wherein forming the OTP memory unit further comprises:
forming a plurality of third conductive segments that are separated from each other in a second conductive layer between the first conductive layer and the continuous active region; and
forming a via between the second conductive layer and the active region, to couple a fourth conductive segment of the plurality of third conductive segments to the first conductive segment, for transmitting the programming signal,
wherein the plurality of third conductive segments, excluding the fourth conductive segment, have no programming signal transmitting there between.

10. The method of claim 6, wherein forming the OTP memory unit further comprises:
forming at least one second MTJ component in the first conductive layer and separated from the first MTJ component,
wherein the at least one second MTJ component is electrically floating.

11. The method of claim 7, wherein
in at least two adjacent cells of the OTP memory unit,
the first gate, the active region and the first structure extend in the same direction, and
the active region extends across at least one cell boundary of the at least two adjacent cells.

12. The method of claim 6, further comprising:
forming a second memory unit next to the OTP memory unit, comprising:
forming a second MTJ component in the first conductive layer and coupled to the data line that is coupled to the first MTJ component.

13. A method, comprising:
forming two adjacent cells of an one-time-programmable (OTP) memory array next to a memory array, comprising:
forming a continuous active region across a cell boundary between the two adjacent cells;
forming a first conductive segment above the continuous active region and disposed between two adjacent gates;
forming a second conductive segment above the continuous active region and disposed between the two adjacent gates; and
forming a first magnetic tunnel junction (MTJ) component in a first conductive layer above the continuous active region and below the first conductive segment and the second conductive segment,
wherein the first conductive segment and the second conductive segment correspond to first source/drain terminals of a first transistor and a second transistor respectively, and are together coupled to the first MTJ component.

14. The method of claim 13, wherein forming the two adjacent cells of the OTP memory array further comprise:
forming an epitaxy structure within the continuous active region, and disposed across the cell boundary and between the two adjacent gates,
wherein the first conductive segment and the second conductive segment are disposed above the epitaxy structure.

15. The method of claim 13, wherein forming the two adjacent cells of the OTP memory array further comprise:
forming a third conductive segment above the continuous active region, and disposed outside the two adjacent gates, wherein the third conductive segment corresponds to a second source/drain terminal of the first transistor,
wherein in a programming operation, the third conductive segment is configured to receive a first voltage, and the first conductive segment is configured to receive a second voltage from a word line, and to couple the second voltage to the second conductive segment.

16. The method of claim 13, wherein forming the two adjacent cells of the OTP memory array further comprise:
forming a second MTJ component in the first conductive layer and separated from the first MTJ component, wherein in a programming operation, the second MTJ component is electrically floating, and the first MTJ component is coupled to the first conductive segment and the second conductive segment, for writing a bit data into the first MTJ component.

17. The method of claim 16, wherein forming the two adjacent cells of the OTP memory array further comprise:
forming a third conductive segment and a fourth conductive segment in a second conductive layer between the first conductive layer and the continuous active region, wherein in a layout view, the third conductive segment is overlapped with the second MTJ component, and the fourth conductive segment is overlapped with the first MTJ component; and
forming a via between the second conductive layer and the continuous active region, to couple the fourth conductive segment to the first conductive segment.

18. The method of claim 13, wherein forming the two adjacent cells of the OTP memory array further comprise:
forming a first conductive rail in the first conductive layer and separated from the first MTJ component; and
forming a second conductive rail in a second conductive layer between the first conductive layer and the continuous active region,
wherein the first conductive rail and the second conductive rail are configured to couple a voltage to the two adjacent gates that correspond to gate terminals of the first transistor and the second transistor, for activating the first transistor and the second transistor.

19. The method of claim 13, wherein forming the two adjacent cells of the OTP memory array further comprise:
forming a third conductive rail above the first conductive layer, and coupled to at least one memory cell of the memory array,
wherein in a programming operation, the third conductive rail is configured to couple a voltage to the first conductive segment, the second conductive segment and the first MTJ component, for changing a ferromagnetic state of the first MTJ component.

20. The method of claim 13, wherein
a width of each one of the two adjacent cells is a cell height, and
a width of the continuous active region is in a range of the cell height to twice of the cell height.

* * * * *